(12) United States Patent
Otsuki

(10) Patent No.: US 6,204,540 B1
(45) Date of Patent: Mar. 20, 2001

(54) MEMORY CELL STRUCTURE OF A MASK PROGRAMMABLE READ ONLY MEMORY WITH ION-IMPLANTATION STOPPER FILMS

(75) Inventor: Kazutaka Otsuki, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/333,992

(22) Filed: Jun. 16, 1999

(30) Foreign Application Priority Data

Jun. 16, 1998 (JP) .................................................. 10-168105

(51) Int. Cl.[7] ................................................. H01L 27/112
(52) U.S. Cl. .............................................. 257/390; 438/276
(58) Field of Search ................................. 257/390, 391, 257/392, 647; 438/130, 275, 278, 276

(56) References Cited

U.S. PATENT DOCUMENTS

| 4,208,780 | * | 6/1980 | Richman | ................................ | 29/571 |
| 4,356,042 | * | 10/1982 | Gedaly et al. | ........................ | 257/390 |
| 5,091,328 | * | 2/1992 | Miller | .................................... | 257/390 |
| 5,946,576 | * | 8/1999 | Wen | ..................................... | 438/278 |

FOREIGN PATENT DOCUMENTS

| 372677 | 2/1991 | (JP) . |
| 3218065 | 9/1991 | (JP) . |
| 4213871 | 8/1992 | (JP) . |
| 8227978 | 9/1996 | (JP) . |
| 9116030 | 5/1997 | (JP) . |
| 10-41411 | 2/1998 | (JP) . |

* cited by examiner

*Primary Examiner*—David Hardy
(74) *Attorney, Agent, or Firm*—Young & Thompson

(57) ABSTRACT

A semiconductor structure includes a semiconductor active region of a first conductivity type including a channel region and a non-channel region surrounding the channel region; an insulation film extending over at least the channel region; at least a control electrode on the insulation film for applying an electric field to the channel region; at least a first diffusion region of the first conductivity type occupying the channel region for defining a threshold voltage of the channel region; and at least an ion-implantation stopper film covering at least a part of the non-channel region but not covering at least a center region of the control electrode, and the ion-implantation stopper film being made of a material preventing ions from penetrating the ion-implantation stopper film in an ion-implantation for forming the first diffusion region.

24 Claims, 26 Drawing Sheets

MEMORY CELL STRUCTURE OF A MASK PROGRAMMABLE READ ONLY MEMORY WITH ION-IMPLANTATION STOPPER FILMS

BACKGROUND OF THE INVENTION

The present invention relates to a semiconductor device and a method of forming the same, and more particularly to a memory cell structure of a mask programmable read only memory and a mask ROM coding method.

A non-volatile semiconductor memory device has memory cells, each of which has a field effect transistor such as a MOS field effect transistor serving as a switching device and a capacitor for storing any one of two different voltage levels representing 1-bit binary digit information. The two different voltage levels depend upon an ON or OFF state of the MOS field effect transistor.

In order to set a threshold voltage level for ON and OFF switching operations of the MOS field effect transistor, a selective ion-implantation to a channel region of the MOS field effect transistor is carried out by use of a mask. Such ion-implantation into the channel region of the MOS field effect transistor for the purpose of setting or controlling the threshold voltage level for ON and OFF switching operations of the MOS field effect transistor is so called to be code ion-implantation.

The mask to be used for the ROM coding through the code ion-implantation is carried out as follows. After a gate electrode of the MOS field effect transistor has been formed or an inter-layer insulator has been formed over the gate electrode, then a resist such as a photo-resist is applied and then an opening is formed in the photo-resist so that the opening is positioned over the channel region of the MOS field effect transistor to form a photo-resist pattern. Assuming that the MOS field effect transistor is of the n-channel type, ions including boron are implanted by use of the photo-resist pattern as a mask. This ROM coding method has been known and is, for example, disclosed in Japanese laid-open patent publication No. 6-268178.

FIG. 1A is a fragmentary plane view illustrative of a conventional flat-structure memory cell of a mask programmable read only memory device. FIG. 1B is a fragmentary cross sectional elevation view illustrative of the conventional flat-structure memory cell taken along an M-N line of FIG. 1A.

The above memory cell structure is formed over a p-type semiconductor substrate 101. A plurality of stripe-shaped n+-type diffusion regions 102 selectively extend in an upper region of the p-type semiconductor substrate 101 so that the stripe-shaped n+-type diffusion regions 102 are aligned at a constant pitch and in parallel to each other, wherein each of the stripe-shaped n+-type diffusion regions 102 has a longitudinal direction along a first direction. A plurality of gate electrodes 104 selectively extend over the gate oxide film 103 so that the gate electrodes 104 are aligned at a constant pitch and in parallel to each other, wherein each of the gate electrodes 104 has a longitudinal direction along a second direction perpendicular to the first direction. A plurality of stripe-shaped p-type diffusion regions 105 selectively extend in the upper region of the p-type semiconductor substrate 101 except under the gate electrodes 104. The stripe-shaped p-type diffusion regions 105 are provided for isolating adjacent two of the stripe-shaped n+-type diffusion regions 102 from each other so that the stripe-shaped p-type diffusion regions 105 are aligned at a constant pitch and in parallel to each other, wherein each of the stripe-shaped p-type diffusion regions 105 has a longitudinal direction along the second direction.

An inter-layer insulator 106 extends entirely over the gate electrodes 104 and the semiconductor substrate 101. A resist mask 107 is provided over the inter-layer insulator 106, wherein the resist mask 107 has a square-shaped opening 108 which is positioned over a channel region under the gate electrode 104. The resist mask 107 with the square-shaped opening 108 is used as a mask for carrying out the ROM code ion-implantation to form a ROM code diffusion region 109. This ROM code diffusion region 109 extends in a selected upper region of the semiconductor substrate 101 and under the gate electrode 104 and parts of the p-type diffusion regions 105.

FIGS. 2A through 2D are fragmentary cross sectional elevation views illustrative of the conventional flat-structure memory cells in sequential steps involved in a conventional method of forming the conventional flat-structure memory cell of FIGS. 1A and 1B.

With reference to FIG. 2A, the stripe-shaped n+-type diffusion regions 102 not illustrated are selectively formed in an upper region of the p-type semiconductor substrate 101 so that the stripe-shaped n+-type diffusion regions 102 are aligned at a constant pitch and in parallel to each other, wherein each of the stripe-shaped n+-type diffusion regions 102 has a longitudinal direction along a first direction. A gate oxide film 103 is formed by a thermal oxidation. A plurality of the gate electrodes 104 are selectively formed over the gate oxide film 103 by photolithography technique and subsequent dry etching process, so that the gate electrodes 104 are aligned at a constant pitch and in parallel to each other, wherein each of the gate electrodes 104 has a longitudinal direction along a second direction perpendicular to the first direction. The gate electrodes 104 may comprise polysilicon films or refractory metal polycide film.

With reference to FIG. 2B, the gate electrodes 104 are used as masks for ion-implantation of boron and subsequent heat treatment whereby the stripe-shaped p-type diffusion regions 105 are selectively formed in the upper region of the p-type semiconductor substrate 101 except under the gate electrodes 104 for isolating adjacent two of the stripe-shaped n+-type diffusion regions 102 from each other so that the stripe-shaped p-type diffusion regions 1.05 are aligned at a constant pitch and in parallel to each other, wherein each of the stripe-shaped p-type diffusion regions 105 has a longitudinal direction along the second direction.

With reference to FIG. 2C, a silicon oxide film is entirely deposited by a chemical vapor deposition method to form the inter-layer insulator 106 which extends entirely over the gate electrodes 104 and the semiconductor substrate 101.

With reference to FIG. 2D, a resist mask 107 is provided over the inter-layer insulator 106, wherein the resist mask 107 has a square-shaped opening 108 which is positioned over a channel region under the gate electrode 104. The resist mask 107 with the square-shaped opening 108 is used as a mask for carrying out the ROM code ion-implantation into a selected region under the gate electrode 104 and parts of the p-type diffusion regions 105. A heat treatment is carried out for thermal diffusion to form a ROM code diffusion region 109. This ROM code diffusion region 109 extends in a selected upper region of the semiconductor substrate 101 and under the gate electrode 104 and parts of the p-type diffusion regions 105. The provision of the ROM code diffusion region 109 increases a threshold voltage of the MOS field effect transistor.

As well illustrated in FIG. 2D, the ROM code diffusion region 109 extends not only under the gate electrode 104 but also under parts of the p-type diffusion regions 105, even the ROM code diffusion region 109 is intended to be formed but only under the gate electrode 104. For the above described conventional technique, it is difficult to limit the ROM code diffusion region 109 into the channel region under the gate electrode 104. The expansion in the lateral direction of the ROM code diffusion region 109, however, causes a variation in threshold voltage from the intended or designed value.

FIG. 3A is a fragmentary plane view illustrative of the above conventional mask ROM coding ion-implantation to form the conventional flat-structure memory cell of the mask programmable read only memory device of FIG. 1A. FIG. 3B is a fragmentary cross sectional elevation view illustrative of the above conventional mask ROM coding ion-implantation to form the conventional flat-structure memory cell of the mask programmable read only memory device of FIG. 1B.

It is difficult for the conventional mask ROM coding ion-implantation to prevent substantive variation in density of the patterns of the openings of the resist mask to be used for the mask ROM coding ion-implantation. The variation in density of the patterns of the openings of the resist mask causes a substantive variation in size of the openings of the resist mask. FIGS. 3A and 3B illustrate the high density region in which the density of the openings is higher than the other region, whilst the FIGS. 1A and 1B illustrate the low density region in which the density of the openings is lower than the other region. The size of the openings in the high density region, in which the density of the openings is higher than the other region, is likely to be larger than the designed or intended size, if the size of the openings in the low density region, in which the density of the openings is lower than the other region, corresponds to the designed or intended side. Namely, even the designed size of the opening 108a in the high density region is "X", the actual size of the opening 108a is "Y" which is larger than "X". The size of the openings in the high density region is likely to be enlarged from the designed or intended size.

If the resist mask having the opening size variation from the designed or intended size is used for carrying out the mask ROM coding ion-implantation to form the ROM code diffusion regions 109a and 109b, the size in lateral directions of the ROM code diffusion regions 109a and 109b is larger than the designed or intended size due to enlargement in size of the openings of the resist mask. If the variation in size of the openings of the resist mask is not so small, then the ROM code diffusion regions 109a and 109b may extend not only under the gate electrode 104a under the opening 108a and under the p-type diffusion regions 105 but also extend opposite end portions of the channel region under the adjacent gate electrode 104 under the resist mask 107, whereby the threshold voltage of the MOS field effect transistor having the gate electrode 104 under the resist mask is unintentionally increased from the designed or intended value.

Further, in the mask ROM code ion-implantation process, the ions pass through the inter-layer insulator 106 and also through the gate electrodes 104a and 104b, during which the ions are scattered by atoms of the inter-layer insulator 106 and the gate electrodes 104a and 104b and also scattered by interface regions of the inter-layer insulator 106 and the gate electrodes 104a and 104b, for example by the side walls of the gate electrodes 104a and 104b. The scattering of the ions causes change in direction of the penetration of the ions from the intended vertical direction, whereby the ion-implanted regions are also unintentionally expanded in the lateral directions. This further raises the above problems in excess enlargement in the lateral direction of the size of the ROM code diffusion regions 109a and 109b.

The above problems in excess enlargement in the lateral direction of the size of the ROM code diffusion regions or in the excess extension of the ROM code diffusion regions to the adjacent channel region of the adjacent MOS field effect transistor of the adjacent memory cell become remarkable as the density of integration of the mask programmable read only memory device is required to be increased. The above problems make it difficult to realize the required increase in density of the integration of the mask programmable read only memory device.

In order to reduce the variation in size of the openings of the resist mask to be used for carrying out the mask ROM code ion-implantation to form the ROM code diffusion regions, an extremely high accuracy in photo-lithography technique is required which is, however, extremely expensive, resulting in increase in the manufacturing cost of the mask programmable read only memory device.

In the above circumstances, it had been required to develop a novel memory cell structure having a single MOS field effect transistor which is free from the above problems.

SUMMARY OF THE INVENTION

Accordingly, it is an object of the present invention to provide a novel memory cell structure having a single MOS field effect transistor which is free from the above problems.

It is a further object of the present invention to provide a novel memory cell structure having a single MOS field effect transistor which is suitable for preventing any substantive expansion in lateral directions of the ROM code diffusion region.

It is a still further object of the present invention to provide a novel memory cell structure having a single MOS field effect transistor which is suitable for preventing any substantive variation in threshold voltage of the MOS field effect transistor.

It is yet a further object of the present invention to provide a novel memory cell structure having a single MOS field effect transistor which is suitable for allowing the semiconductor memory device such as the mask programmable read only memory to be scaled down.

It is a further more object of the present invention to provide a novel memory cell structure having a single MOS field effect transistor which is suitable for allowing an increase in density of integration of the semiconductor memory device such as the mask programmable read only memory.

It is still more object of the present invention to provide a novel memory cell structure having a single MOS field effect transistor which is suitable for allowing increase in memory capacity of the semiconductor memory device such as the mask programmable read only memory.

It is moreover object of the present invention to provide a novel memory cell structure having a single MOS field effect transistor which is suitable for allowing a possible reduction in manufacturing cost of the semiconductor memory device such as the mask programmable read only memory.

It is another object of the present invention to provide a novel method of mask ROM code ion-implantation to selectively form a ROM code diffusion region in a highly accurate limited region without any scattering of ions to prevent any expansion or excess diffusion in the lateral directions.

It is still another object of the present invention to provide a novel method of mask ROM code ion-implantation to selectively form a ROM code diffusion region in a novel memory cell structure having a single MOS field effect transistor which is free from the above problems.

It is yet another object of the present invention to provide a novel method of mask ROM code ion-implantation to selectively form a ROM code diffusion region in a novel memory cell structure having a single MOS field effect transistor which is suitable for preventing any substantive expansion in lateral directions of the ROM code diffusion region.

It is further another object of the present invention to provide a novel method of mask ROM code ion-implantation to selectively form a ROM code diffusion region in a novel memory cell structure having a single MOS field effect transistor which is suitable for preventing any substantive variation in threshold voltage of the MOS field effect transistor.

It is an additional object of the present invention to provide a novel method of mask ROM code ion-implantation to selectively form a ROM code diffusion region in a novel memory cell structure having a single MOS field effect transistor which is suitable for allowing the semiconductor memory device such as the mask programmable read only memory to be scaled down.

It is a still additional object of the present invention to provide a novel method of mask ROM code ion-implantation to selectively form a ROM code diffusion region in a novel memory cell structure having a single MOS field effect transistor which is suitable for allowing increase in density of integration of the semiconductor memory device such as the mask programmable read only memory.

It is yet an additional object of the present invention to provide a novel method of mask ROM code ion-implantation to selectively form a ROM code diffusion region in a novel memory cell structure having a single MOS field effect transistor which is suitable for allowing increase in memory capacity of the semiconductor memory device such as the mask programmable read only memory.

It is a further additional object of the present invention to provide a novel method of mask ROM code ion-implantation to selectively form a ROM code diffusion region in a novel memory cell structure having a single MOS field effect transistor which is suitable for allowing a possible reduction in manufacturing cost of the semiconductor memory device such as the mask programmable read only memory.

The present invention provides a semiconductor structure comprising: a semiconductor active region of a first conductivity type including a channel region and a non-channel region surrounding the channel region; an insulation film extending over at least the channel region; at least a control electrode on the insulation film for applying an electric filed to the channel region; at least a first diffusion region of the first conductivity type occupying the channel region for defining a threshold voltage of the channel region; and at least an ion-implantation stopper film covering at least a part of the non-channel region but not covering at least a center region of the control electrode, and the ion-implantation stopper film being made of a material preventing ions from penetrating the ion-implantation stopper film in an ion-implantation for forming the first diffusion region.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

Figure 1A:
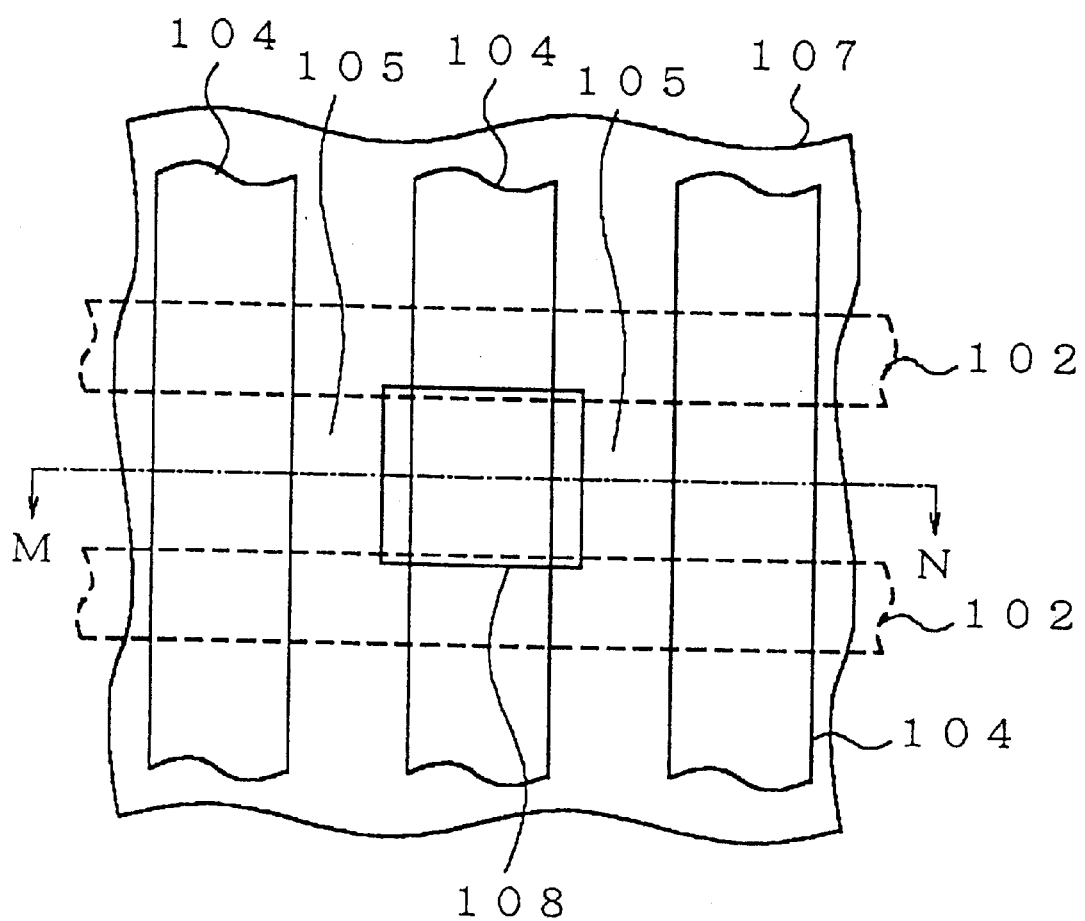
FIG. 1A is a fragmentary plane view illustrative of a conventional flat-structure memory cell of a mask programmable read only memory device.
Figure 1B:
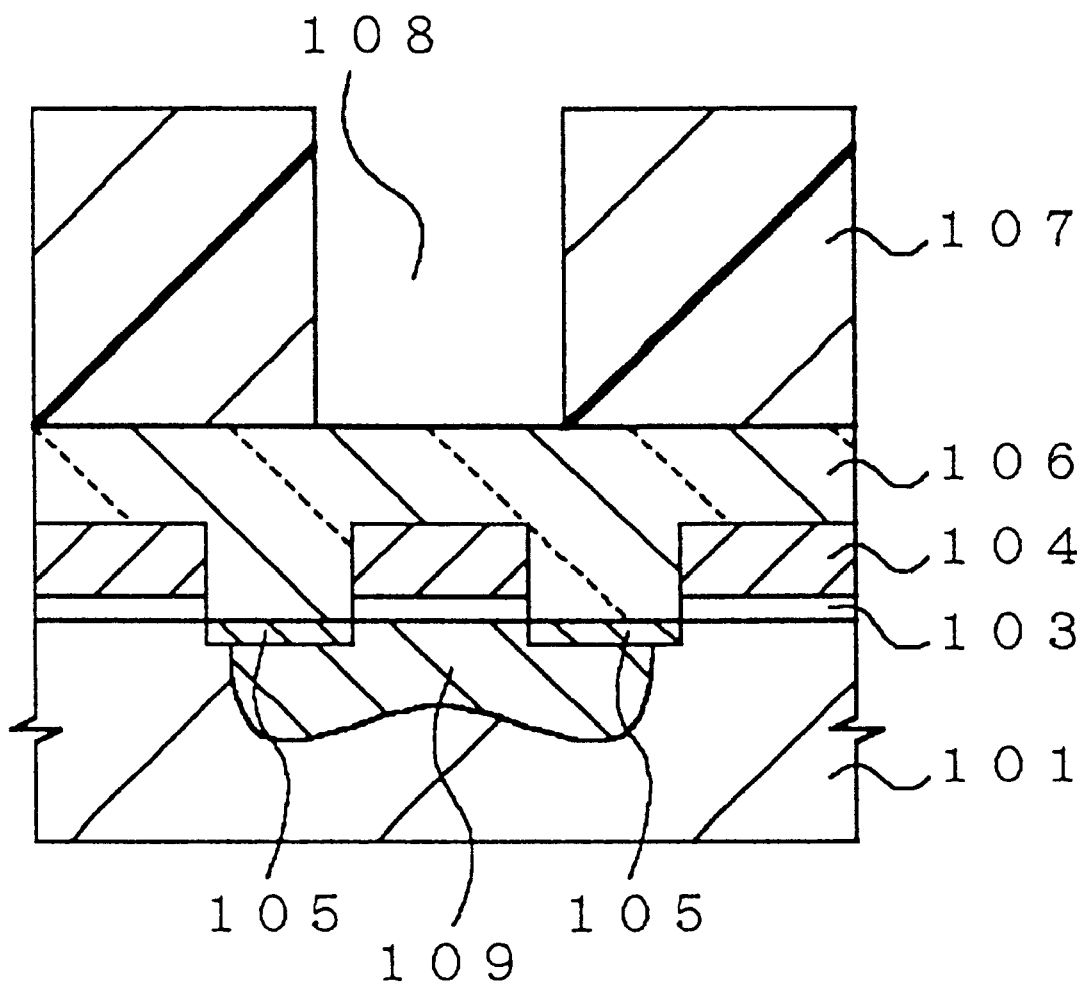
FIG. 1B is a fragmentary cross sectional elevation view illustrative of the conventional flat-structure memory cell taken along an M-N line of FIG. 1A.
Figure 2A:
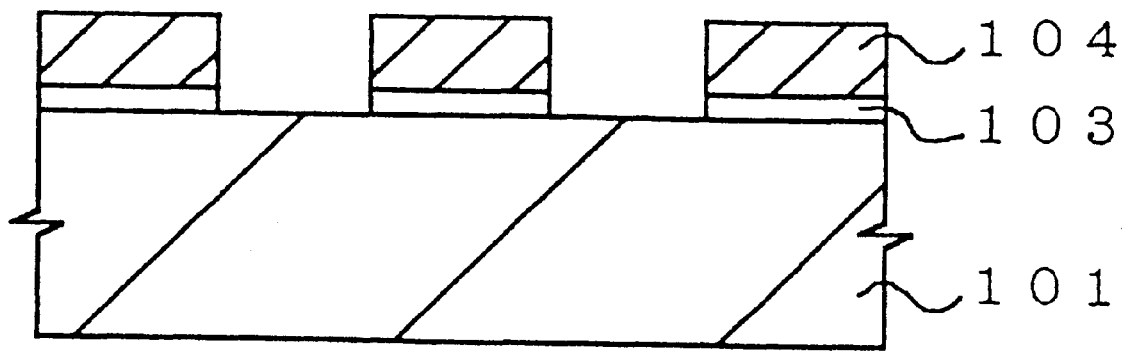
FIGS. 2A through 2D are fragmentary cross sectional elevation views illustrative of the conventional flat-structure memory cells in sequential steps involved in a conventional method of forming the conventional flat-structure memory cell of FIGS. 1A and 1B.
Figure 2B:
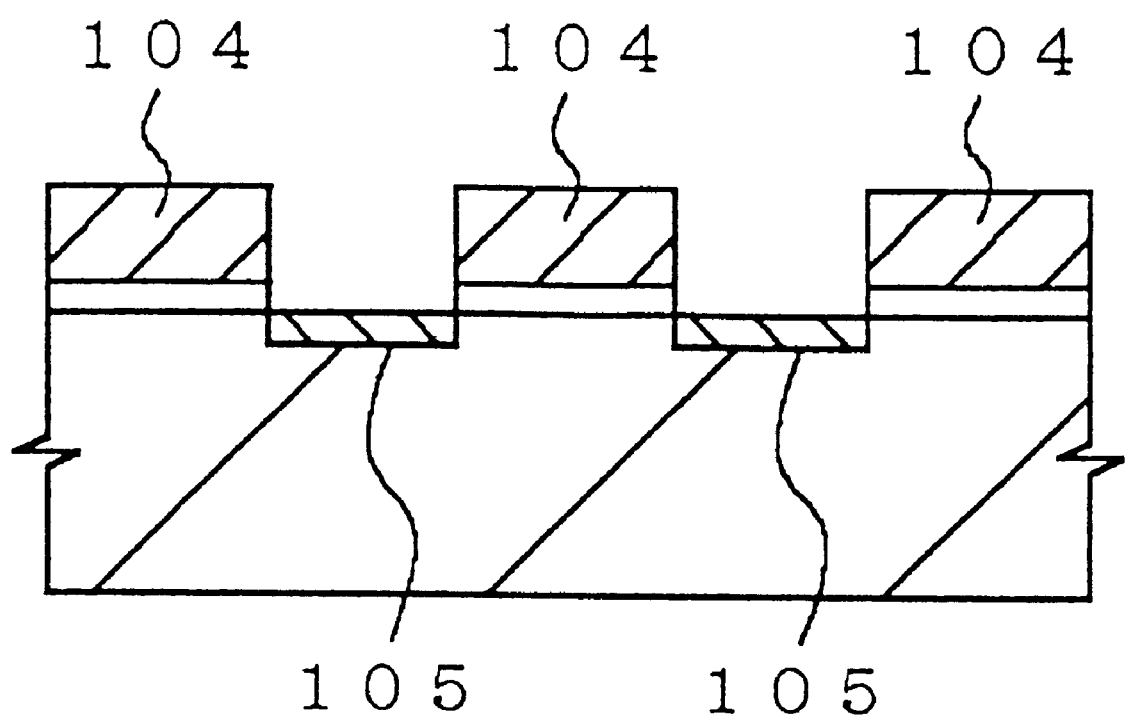
Figure 2C:
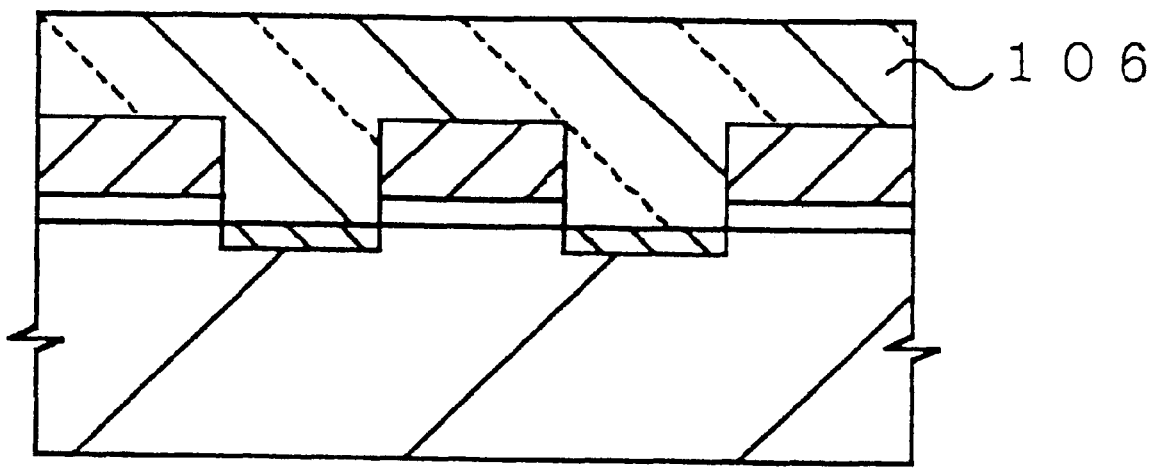
Figure 2D:
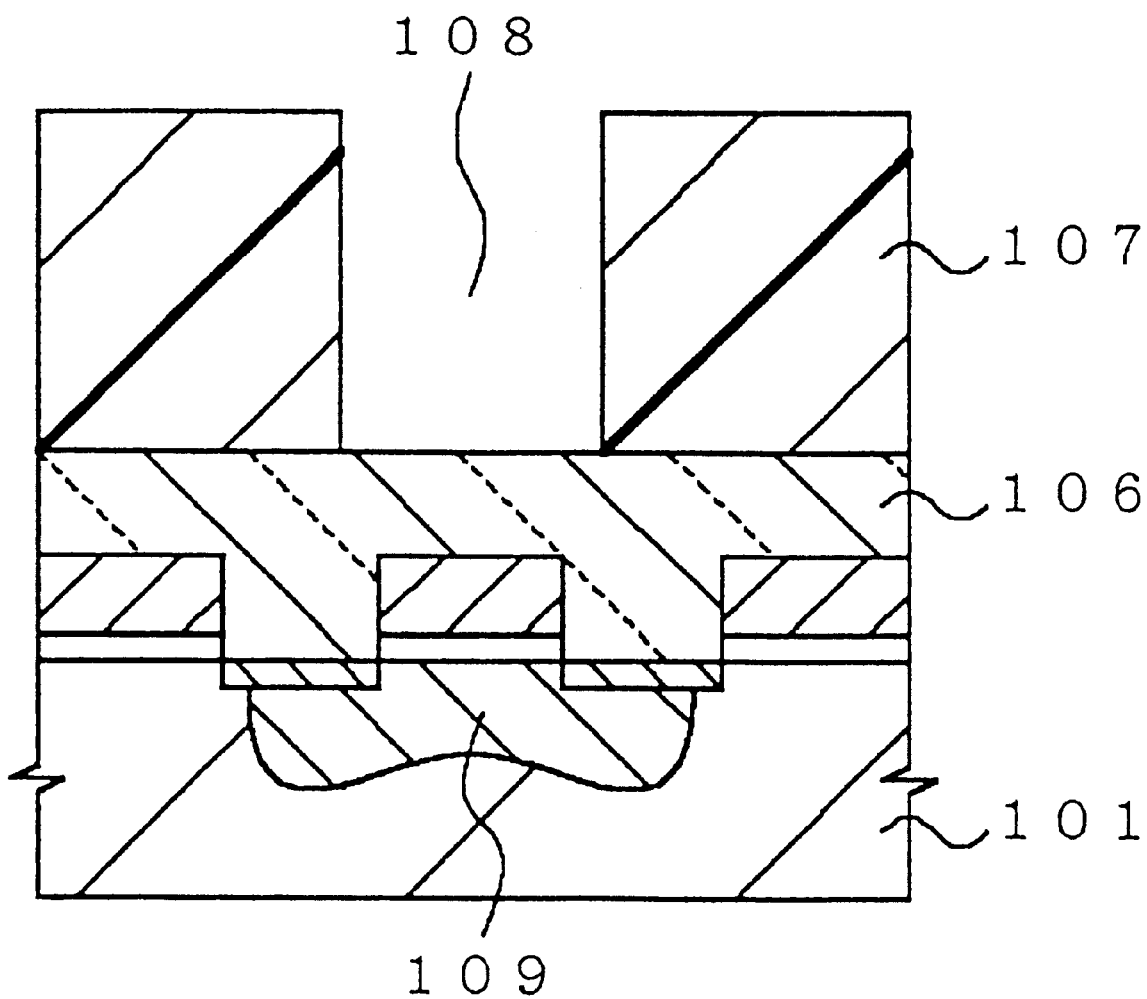
Figure 3A:
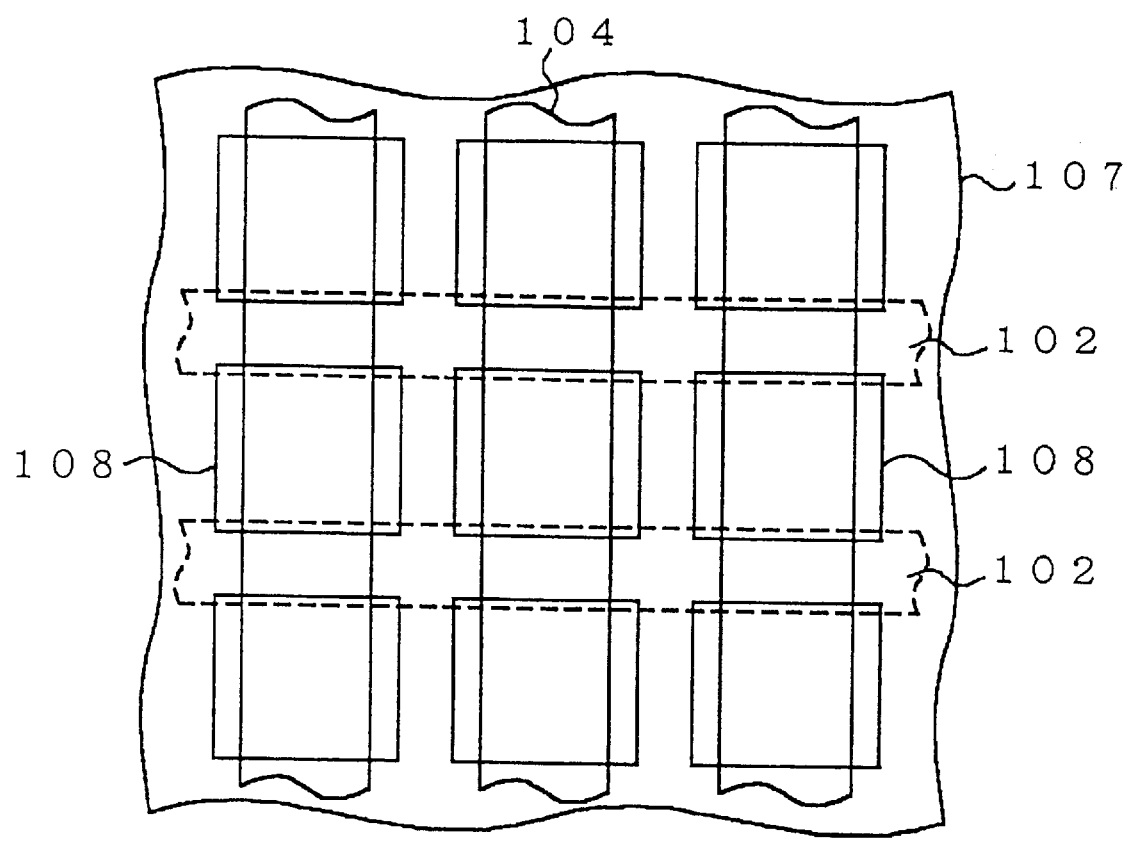
FIG. 3A is a fragmentary plane view illustrative of the above conventional ROM coding ion-implantation to form the conventional flat-structure memory cell of the mask programmable read only memory device of FIG. 1A.
Figure 3B:
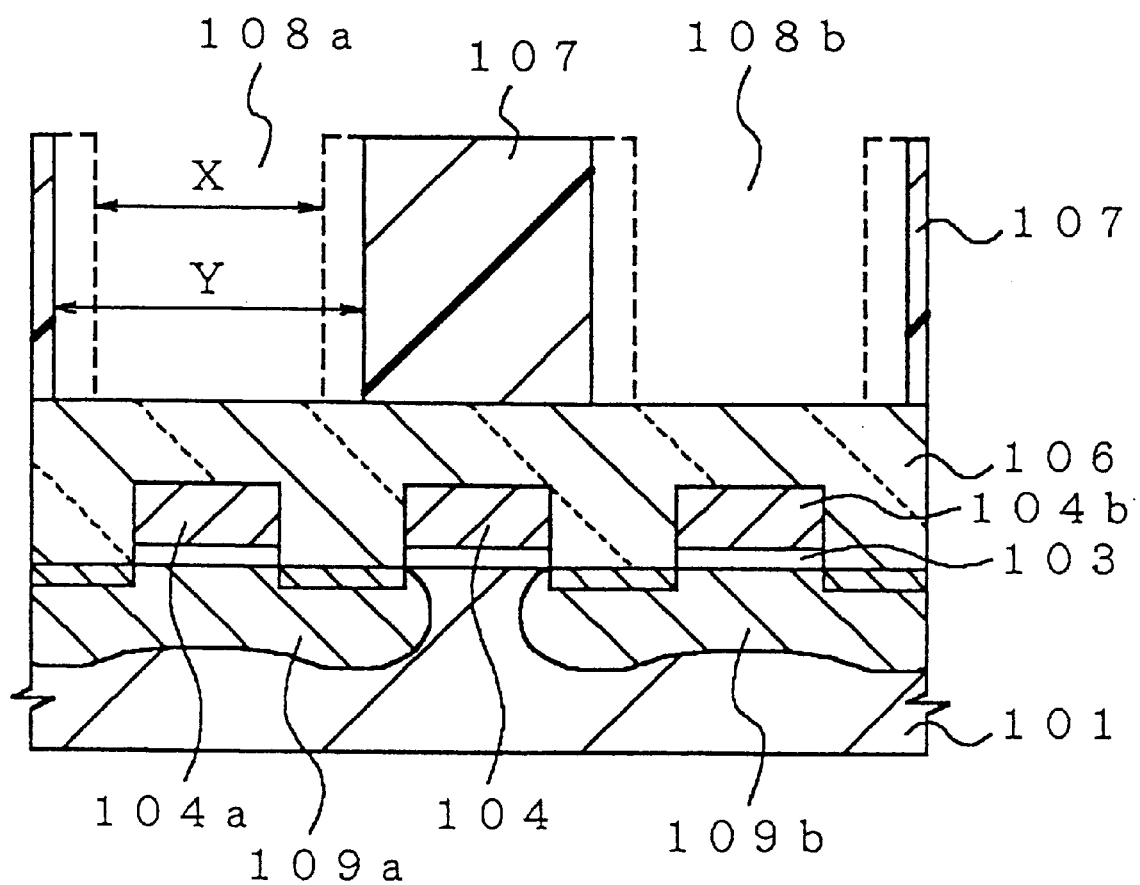
FIG. 3B is a fragmentary cross sectional elevation view illustrative of the above conventional ROM coding ion-implantation to form the conventional flat-structure memory cell of the mask programmable read only memory device of FIG. 1B.

The first present invention provides a semiconductor structure comprising: a semiconductor active region of a first conductivity type including a channel region and a non-channel region surrounding the channel region; an insulation film extending over at least the channel region; at least a control electrode on the insulation film for applying an electric filed to the channel region; at least a first diffusion region of the first conductivity type occupying the channel region for defining a threshold voltage of the channel region; and at least an ion-implantation stopper film covering at least a part of the non-channel region but not covering at least a center region of the control electrode, and the ion-implantation stopper film being made of a material preventing ions from penetrating the ion-implantation stopper film in an ion-implantation for forming the first diffusion region.

It is preferable that a plurality of the ion-implantation stopper films extend at least in opposite sides of the control electrode and also extend at least in substantially the same level as the control electrode.

It is further preferable that a plurality of the control electrodes are provided, and the ion-implantation stopper films extend at least in apertures between the control electrodes.

It is furthermore preferable that the ion-implantation stopper films extend not only in the apertures between the control electrodes but also over edge portions of the control electrodes.

It is also preferable that the ion-implantation stopper films extend not only in the apertures between the control electrodes but also within grooves formed in the semiconductor active region and positioned under the apertures, so that lower parts of the ion-implantation stopper films are positioned in opposite sides of the first diffusion region.

It is also preferable that the ion-implantation stopper films are separated by a passivation film from the control electrodes.

It is also preferable that the ion-implantation stopper films are self-aligned to the control electrodes.

It is also preferable that a plurality of the ion-implantation stopper films extend over opposite sides of the control electrode so that ion-implantation stopper films lie above the control electrode.

It is further preferable that plurality of the control electrodes are provided, and an inter-layer insulator is provided which extends within apertures between the control electrodes and also over the control electrodes, and the ion-implantation stopper films extend over the inter-layer insulator within the apertures between the control electrodes.

It is also preferable that the material of the ion-implantation stopper film is an insulation material which comprises at least one element having a large mass number.

It is also preferable that the material of the ion-implantation stopper film comprises a metal oxide.

It is also preferable that the material of the ion-implantation stopper film has a low dielectric constant.

It is also preferable that the material of the ion-implantation stopper film is a conductive material which comprises at least one element having a large mass number.

It is also preferable that the ion-implantation stopper film is grounded so that the ion-implantation stopper film has a around potential.

A semiconductor memory cell structure having a field effect transistor may have the above semiconductor structure of the first present invention.

The second present invention provides a semiconductor memory cell structure comprising: a semiconductor substrate having an active region of a first conductivity type, and the active region including a channel region and a non-channel region surrounding the channel region; source and drain diffusion regions in parts of the non-channel region in the active region; a gate insulation film extending over at least the channel region; a plurality of gate electrodes on the insulation film; at least a first diffusion region of the first conductivity type occupying the channel region for defining a threshold voltage of the channel region; and a plurality of ion-implantation stopper films covering at least parts of the non-channel region in opposite side regions of the gate electrode but not covering at least a center region of the gate electrode, and the ion-implantation stopper film being made of a material preventing ions from penetrating the ion-implantation stopper film in an ion-implantation for forming the first diffusion region.

It is preferable that a plurality of the gate electrodes are provided, and the ion-implantation stopper films extend at least in apertures between the gate electrodes.

It is also preferable that the ion-implantation stopper films extend not only in the apertures between the gate electrodes but also over edge portions of the gate electrodes.

It is also preferable that the ion-implantation stopper films extend not only in the apertures between the gate electrodes but also within grooves formed in the semiconductor active region and positioned under the apertures, so that lower parts of the ion-implantation stopper films are positioned in opposite sides of the first diffusion region.

It is also preferable that the ion-implantation stopper films are separated by a passivation film from the gate electrodes.

It is also preferable that the ion-implantation stopper films are self-aligned to the gate electrodes.

It is also preferable that a plurality of the gate electrodes are provided, and an inter-layer insulator is provided which extends within apertures between the gate electrodes and also over the gate electrodes, and the ion-implantation stopper films extend over the inter-layer insulator within the apertures between the gate electrodes so that the ion-implantation stopper films extend over opposite sides of the gate electrode, and ion-implantation stopper films lie above the gate electrode.

The third present invention provides a semiconductor structure comprising: a semiconductor active region of a first conductivity type including a channel region and a non-channel region surrounding the channel region; an insulation film extending over at least the channel region; at least a control electrode on the insulation film for applying an electric field to the channel region; at least a first diffusion region of the first conductivity type occupying the channel region for defining a threshold voltage of the channel region; and at least an ion-implantation stopper film extending in at least a part of the non-channel region and also at least lying a below level to the control electrode but not underlying the control electrode, and lower parts of the ion-implantation stopper films being positioned in opposite sides of the first diffusion region, and the ion-implantation stopper film being made of a material preventing ions from penetrating the ion-implantation stopper film in an ion-implantation for forming the first diffusion region.

It is preferable that the ion-implantation stopper films extend not only within grooves formed in the semiconductor active region and positioned under the apertures but also in the apertures between the control electrodes.

The fourth present invention provides a method of a code ion-implantation of an impurity into a channel region under a gate electrode of a field effect transistor of a memory cell structure which comprises: a semiconductor substrate having an active region of a first conductivity type, and the active region including a channel region and a non-channel region surrounding the channel region; source and drain diffusion regions in parts of the non-channel region in the active region; a gate insulation film extending over at least the channel region; a plurality of gate electrodes on the insulation film; and at least a first diffusion region of the first conductivity type occupying the channel region for defining a threshold voltage of the channel region, wherein the code ion-implantation is carried out by using a plurality of ion-implantation stopper films as masks covering at least parts of the non-channel region in opposite side regions of the gate electrode but not covering at least a center region of the gate electrode, and the ion-implantation stopper film being made of a material preventing ions from penetrating the ion-implantation stopper film in an ion-implantation for forming the first diffusion region.

Preferred Embodiments

First Embodiment

Figure 4A:
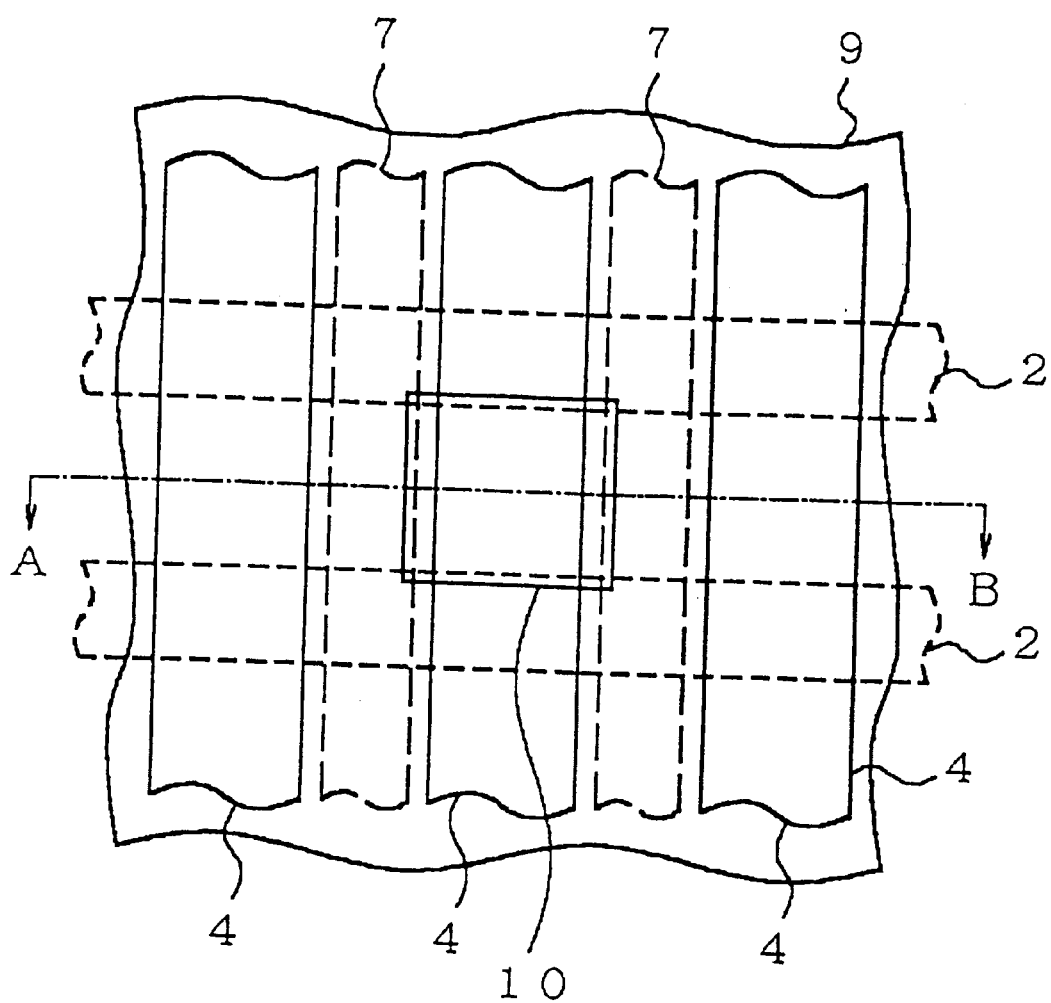
FIG. 4A is a fragmentary plane view illustrative of a novel memory cell structure having a single MOS field effect transistor in a mask programmable read only memory device in first embodiment in accordance with the present invention.
Figure 4B:
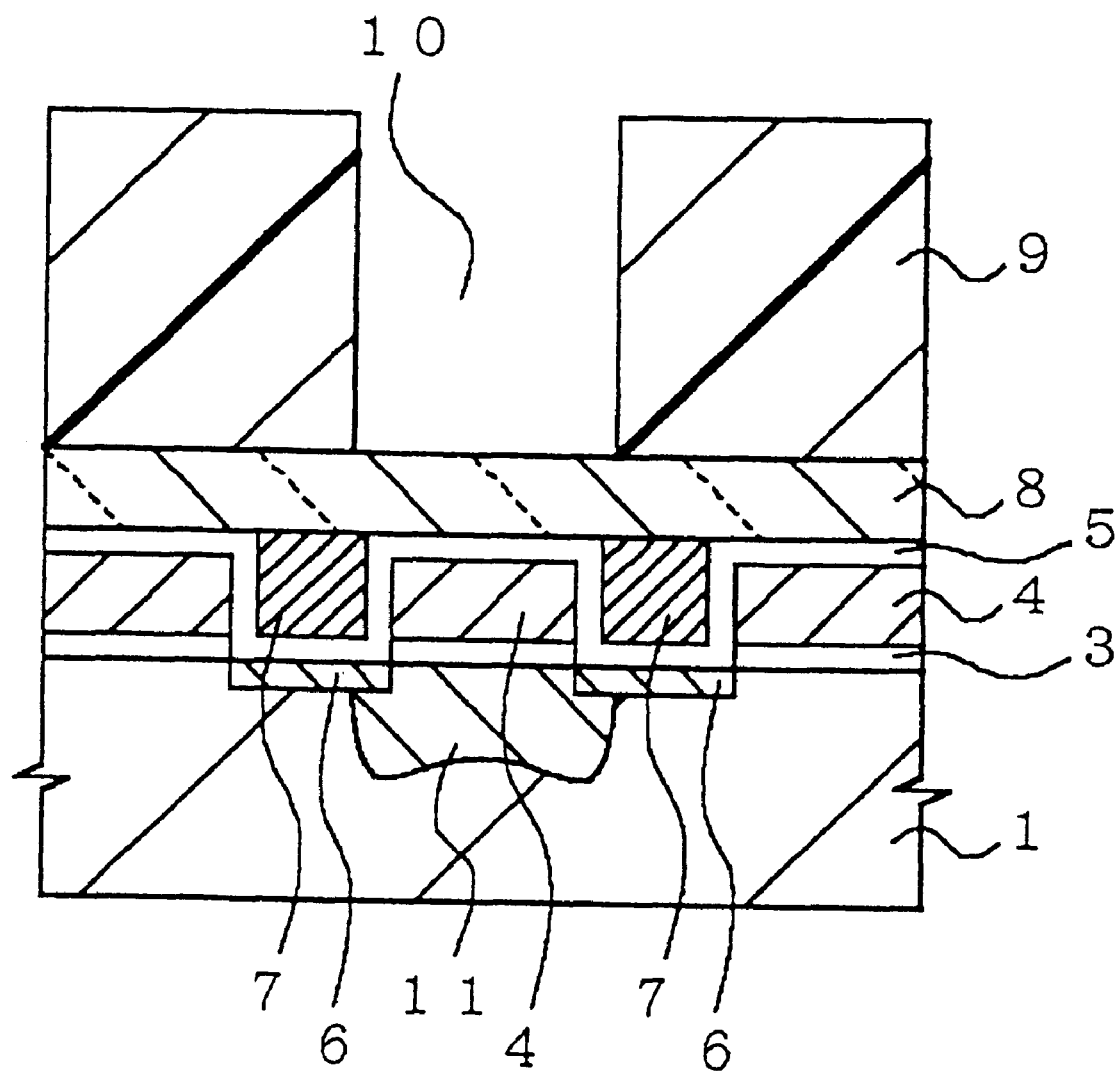
FIG. 4B is a fragmentary cross sectional elevation view illustrative of a novel memory cell structure having a single MOS field effect transistor in a mask programmable read only memory device in first embodiment in accordance with the present invention taken along an A-B line of FIG. 4A.

A first embodiment according to the present invention will be described in detail with reference to the drawings. FIG. 4A is a fragmentary plane view illustrative of a novel memory cell structure having a single MOS field effect transistor in a mask programmable read only memory device. FIG. 4B is a fragmentary cross sectional elevation view illustrative of a novel memory cell structure having a single MOS field effect transistor in a mask programmable read only memory device taken along an A-B line of FIG. 4A.

The above memory cell structure is formed over a p-type semiconductor substrate 1. A plurality of stripe-shaped n+-type diffusion regions 2 selectively extend in an upper region of the p-type semiconductor substrate 1 so that the stripe-shaped n+-type diffusion regions 2 are aligned at a constant pitch and in parallel to each other, wherein each of the stripe-shaped n+-type diffusion regions 2 has a longitudinal direction along a first direction. A plurality of gate electrodes 4 selectively extend over a gate oxide film 3 so that the gate electrodes 4 are aligned at a constant pitch and in parallel to each other, wherein each of the gate electrodes 4 has a longitudinal direction along a second direction perpendicular to the first direction. A plurality of stripe-shaped p-type diffusion regions 6 selectively extend in the upper region of the p-type semiconductor substrate 1 except under the gate electrodes 4. The stripe-shaped p-type diffusion regions 6 are provided for isolating adjacent two of the stripe-shaped n+-type diffusion regions 2 from each other so that the stripe-shaped p-type diffusion regions 6 are aligned at a constant pitch and in parallel to each other, wherein each of the stripe-shaped p-type diffusion regions 6 has a longitudinal direction along the second direction. A passivation film 5 entirely extends on the stripe-shaped p-type diffusion regions 6 as well as extends on side walls of top surfaces of the gate electrodes 4.

A plurality of ion-implantation stopper films 7 extend within apertures defined between the gate electrodes 4 and in contact directly with the passivation film 5 so that the ion-implantation stopper films 7 fill the apertures defined between the gate electrodes 4. The ion-implantation stopper films 7 are aligned at a constant pitch and in parallel to each other and also parallel to the gate electrodes 4, wherein each of the ion-implantation stopper films 7 has a longitudinal direction along the second direction. Each of the ion-implantation stopper films 7 is separated by the passivation film 5 from the adjacent ones of the gate electrodes 4. A distance between the ion-implantation stopper film 7 and the adjacent gate electrode 4 corresponds to a thickness of the passivation film 5. Namely, the ion-implantation stopper films 7 are self-aligned to the gate electrodes 4. The ion-implantation stopper films 7 serve as ion-implantation stopper in a mask ROM code ion-implantation process to form a ROM code diffusion region in a channel region of the MOS field effect transistor for controlling a threshold voltage of the MOS field effect transistor. The ion-implantation stopper films 7 are made of a material which is capable of preventing ions from penetrating through the ion-implantation stopper films 7 and reaching upper regions of the semiconductor substrate 1 under the stripe-shaped p-type diffusion regions 6. The ion-implantation stopper films 7 may be made of insulation or conductive materials, provided that the material is capable of preventing ions from penetrating through the ion-implantation stopper films 7 and reaching upper regions of the semiconductor substrate 1 under the stripe-shaped p-type diffusion regions 6. If the material for the ion-implantation stopper films 7 comprises one or more elements having a large mass number, then the function as the ion-implantation stopper is high. For example, if the material for the ion-implantation stopper films 7 comprises an insulation material, a metal oxide is preferable. Further, the parasitic capacitance between adjacent two of the gate electrodes 4 results in delay in operational speed of the mask programmable read only memory or deterioration in high speed performances of the mask programmable read only memory, for which reason it is also preferable that the material for the ion-implantation stopper films 7 has a low dielectric constant so as to reduce a parasitic capacitance between adjacent two of the gate electrodes 4, thereby preventing any substantive delay in operational speed of the mask programmable read only memory due to the parasitic capacitance. A ROM code diffusion region 11 is also provided for increasing a threshold voltage of the MOS field effect transistor. The ROM code diffusion region 11 extends only under the gate electrode 4 or only in the channel region and in the vicinity of the same. The provision of the ion-implantation stopper films 7 makes it possible to limit the ROM code diffusion region 11 into the channel region under the gate electrode 4. No expansion in the lateral direction of the ROM code diffusion region 11, however, causes no variation in threshold voltage from the intended or designed value.

An inter-layer insulator 8 extends entirely over the ion-implantation stopper films 7 and the passivation film 5. A resist mask 9 is provided over the inter-layer insulator 8, wherein the resist mask 9 has a square-shaped opening 10 which is positioned over the gate electrode 4 which is positioned over the channel region. The resist mask 9 with the square-shaped opening 10 is used as a mask for carrying out the ROM code ion-implantation to form a ROM code diffusion region 11. This ROM code diffusion region 11 extends in a selected upper region of the semiconductor substrate 1 and under the gate electrode 4 and parts of the p-type diffusion regions 6.

The provision of the ion-implantation stopper films 7 makes the memory cell of the mask programmable read only memory free from the problems as engaged with the conventional techniques as described above. It is difficult to prevent any variation in density of the patterns of the openings of the resist mask 9 to be used for the mask ROM coding ion-implantation. The variation in density of the patterns of the openings 10 of the resist mask 9 causes a substantive variation in size of the openings 10 of the resist mask 9. The size of the opening 10 in the high density region, in which the density of the openings 9 is higher than the other region, is likely to be larger than the designed or intended size, if the size of the opening 10 in the low density region, in which the density of the openings 10 is lower than the other region, corresponds to the designed or intended side.

However, in accordance with the present invention, the provision of the ion-implantation stopper films 7 makes the mask programmable read only memory free from the problems due to the variation in size of the openings of the resist mask- Even if the resist mask 9 having the opening size variation from the designed or intended size is used for carrying out the mask ROM coding ion-implantation to form the ROM code diffusion region 11, the ion-implantation stopper films 7 capture ions of the ion-implantation except for ions to be implanted through the gate electrode 4 into the channel region under the gate electrode 4 as well as through the passivation film 5 on side walls of the gate electrode 4 to adjacent regions to the channel region, whereby the ion-implantation stopper films 7 prevent ions from passing through the ion-implantation stopper films 7 and reach the stripe-shaped p-type diffusion regions 6 and upper regions of the semiconductor substrate 1 under the stripe-shaped p-type diffusion regions 6. As a result, the highly accurate positions of the ion-implantation stopper films 7 allow the required highly accurate control to the size in lateral directions of the ROM code diffusion region 11, so that the size in lateral directions of the ROM code diffusion region 11 just corresponds to the designed or intended size with enlargement in the size of the opening 10 of the resist mask 9. Even if the variation in size of the opening 10 of the resist mask 9 is not so small, then the ROM code diffusion region 11 extends but only in the channel region under the gate electrode 4 and adjacent regions to the channel region. Substantially no ions are, however, implanted under the adjacent channel region under the adjacent gate electrode 4, whereby the threshold voltage of the MOS field effect transistor has substantially no variation from the designed or intended value.

Further, in the mask ROM code ion-implantation process, the ions pass through the inter-layer insulator 8 and also through the gate electrode 4, during which the ions are scattered by atoms of the inter-layer insulator 8 and the gate electrode 4. The scattered ions are, however, captured into the ion-implantation stopper films 7 and thus are prevented from passing or penetrating through the ion-implantation stopper films 7 to the regions around the channel region under the gate electrode 4 positioned under the opening 10 of the resist mask 9. Substantially no ions are, however, implanted under the adjacent channel region under the adjacent gate electrode 4, whereby the threshold voltage of the MOS field effect transistor has substantially no variation from the designed or intended value.

The provision of the ion-implantation stopper films 7 makes the memory cell structure free from the conventional problems in excess enlargement in the lateral direction of the size of the ROM code diffusion regions or in the excess extension of the ROM code diffusion regions to the adjacent channel region of the adjacent MOS field effect transistor of the adjacent memory cell. This makes it possible to realize the required increase in density of the integration of the mask programmable read only memory device.

It is unnecessary for the above novel structure to reduce the variation in size of the openings of the resist mask to be used for carrying out the mask ROM code ion-implantation to form the ROM code diffusion region 11. Any extremely high accuracy in photo-lithography technique is not required which is, however, extremely expensive. This makes it possible to reduce the manufacturing cost of the mask programmable read only memory device.

The above novel mercury cell structure having the single MOS field effect transistor with the ion-implantation stopper films 7 is suitable for preventing any substantive expansion in lateral directions of the ROM code diffusion region.

The above novel memory cell structure having the single MOS field effect transistor with the ion-implantation stopper films 7 is also suitable for preventing any substantive variation in threshold voltage of the MOS field effect transistor.

The above novel memory cell structure having the single MOS field effect transistor with the ion-implantation stopper films 7 is also suitable for allowing the semiconductor memory device such as the mask programmable read only memory to be scaled down.

The above novel memory cell structure having the single MOS field effect transistor with the ion-implantation stopper films 7 is also suitable for allowing increase in density of integration of the semiconductor memory device such as the mask programmable read only memory.

The above novel memory cell structure having the single MOS field effect transistor with the ion-implantation stopper films 7 is also suitable for allowing increase in memory capacity of the semiconductor memory device such as the mask programmable read only memory.

The above novel memory cell structure having the single MOS field effect transistor with the ion-implantation stopper films 7 is also suitable for allowing a possible reduction in manufacturing cost of the semiconductor memory device such as the mask programmable read only memory.

FIGS. 5A through 5D are fragmentary cross sectional elevation views illustrative of a novel memory cell structure having a single MOS field effect transistor in a mask programmable read only memory device in sequential steps involved in a novel method of forming the novel flat-structure memory cell of FIGS. 4A and 4B.

Figure 5A:
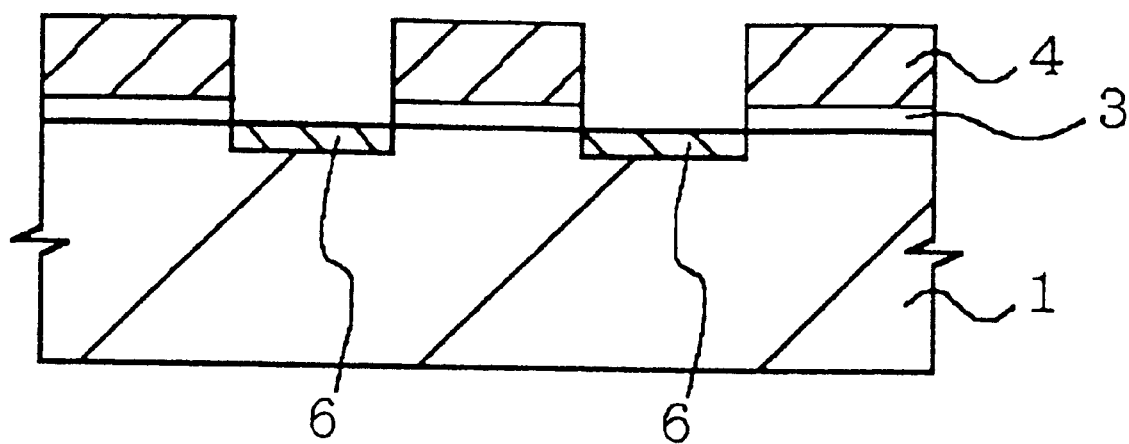
FIGS. 5A through 5D are fragmentary cross sectional elevation views illustrative of a novel memory cell structure having a single MOS field effect transistor in a mask programmable read only memory device in sequential steps involved in a novel method of forming the novel flat-structure memory cell of FIGS. 4A and 4B in first embodiment in accordance with the present invention.

With reference to FIG. 5A, the stripe-shaped n+-type diffusion regions 2 not illustrated are selectively formed in an upper region of the p-type semiconductor substrate 1 so that the stripe-shaped n+-type diffusion regions 2 are aligned at a constant pitch and in parallel to each other, wherein each of the stripe-shaped n+-type diffusion regions 2 has a longitudinal direction along a first direction. The stripe-shaped n+-type diffusion regions 2 may be formed by a selective ion-implantation of arsenic at an ion-implantation energy of 70 keV and at a dose of 1E15 $cm^{-2}$ and a subsequent heat treatment. A gate oxide film 3 is formed by a thermal oxidation. A plurality of the gate electrodes 4 are selectively formed over the gate oxide film 3 by photolithography technique and subsequent dry etching process, so that the gate electrodes 4 are aligned at a constant pitch and in parallel to each other, wherein each of the gate electrodes 4 has a longitudinal direction along a second direction perpendicular to the first direction. The gate electrodes 4 may comprise a polycide film which comprises laminations of phosphorus doped polysilicon films having a thickness of 100 nanometers and a tungsten silicide film having a thickness of 100 nanometers. The gate electrodes 4 are used as masks for ion-implantation of boron at an ion-implantation energy of 30 keV and at a dose of 2E13 $cm^{-2}$ and a subsequent heat treatment, whereby the stripe-shaped p-type diffusion regions 6 are selectively formed in the upper region of the p-type semiconductor substrate 1 except under the gate electrodes 4 for isolating adjacent two of the stripe-shaped n+-type diffusion regions 2 from each other so that the stripe-shaped p-type diffusion regions 6 are aligned at a constant pitch and in parallel to each other, wherein each of the stripe-shaped p-type diffusion regions 6 has a longitudinal direction along the second direction.

Figure 5B:
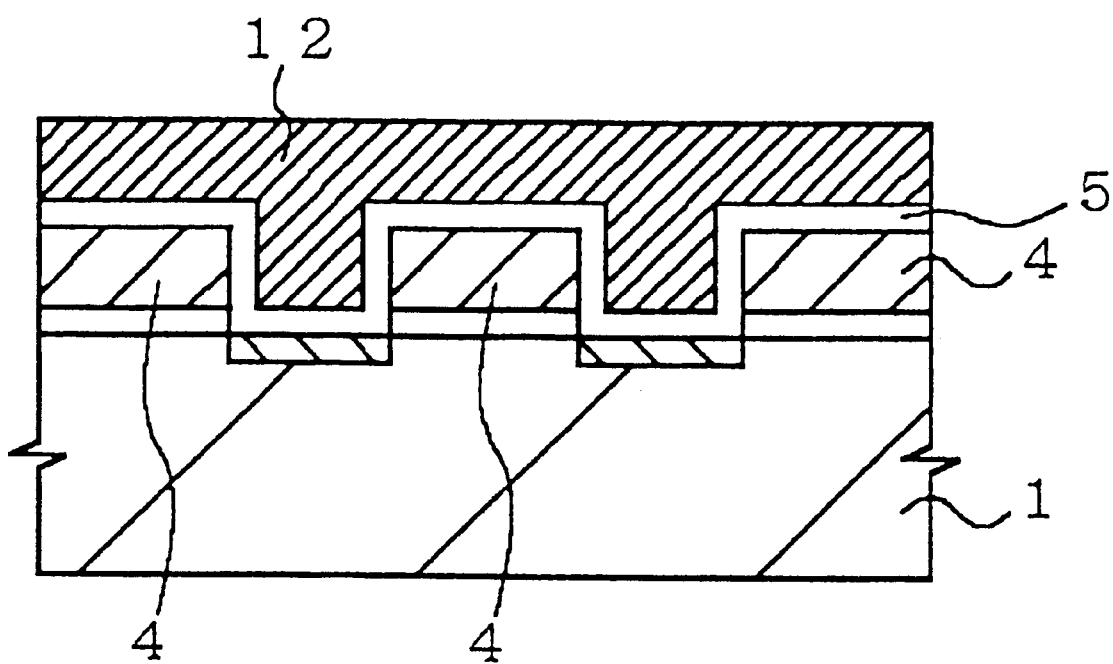

With reference to FIG. 5B, a silicon oxide film is entirely deposited by a chemical vapor deposition method to form a passivation film 5 which entirely extends on the stripe-shaped p-type diffusion regions 6 as well as extends on side walls of top surfaces of the gate electrodes 4. An ion-implantation stopper material 12 is also entirely deposited on the passivation film 5 by a chemical vapor deposition method so that the ion-implantation stopper material 12 completely fills apertures, each of which is defined between the adjacent two of the gate electrodes 4 and also deposited over the gate electrodes 4, whereby a tungsten film having a thickness of 500 nanometers is thus formed. In place of the tungsten film, laminations of a titanium nitride film and a tungsten film are also available.

Figure 5C:
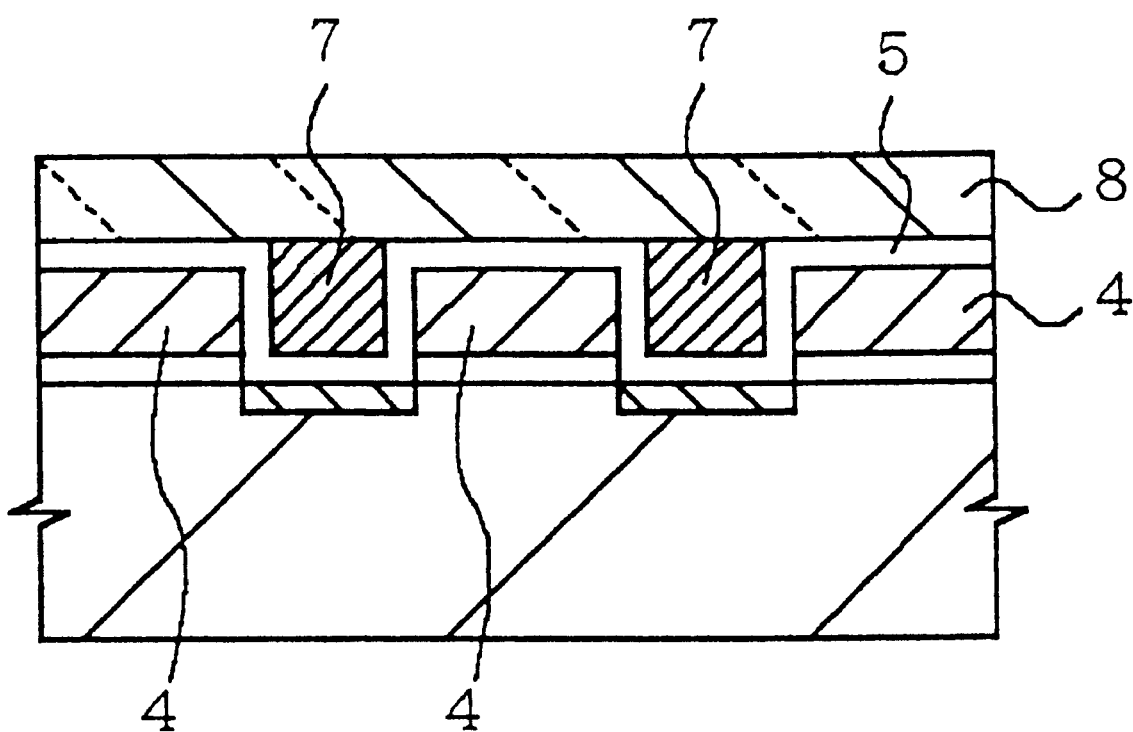

With reference to FIG. 5C, the deposited ion-implantation stopper material 12 is then subjected to a chemical mechanical polishing to selectively remove the deposited ion-implantation stopper material 12 except within the apertures defined between the gate electrodes 4, whereby the deposited ion-implantation stopper material 12 remain only within the apertures defined between the gate electrodes 4, so that the ion-implantation stopper films 7 are thus formed within the apertures defined between the gate electrodes 4.

A silicon oxide film is entirely deposited by a chemical vapor deposition method to form the inter-layer insulator 8 which extends on the ion-implantation stopper films 7 and the passivation film 5. The inter-layer insulator 8 is then subjected to a chemical mechanical polishing for planarization of a top surface of the inter-layer insulator 8.

Figure 5D:
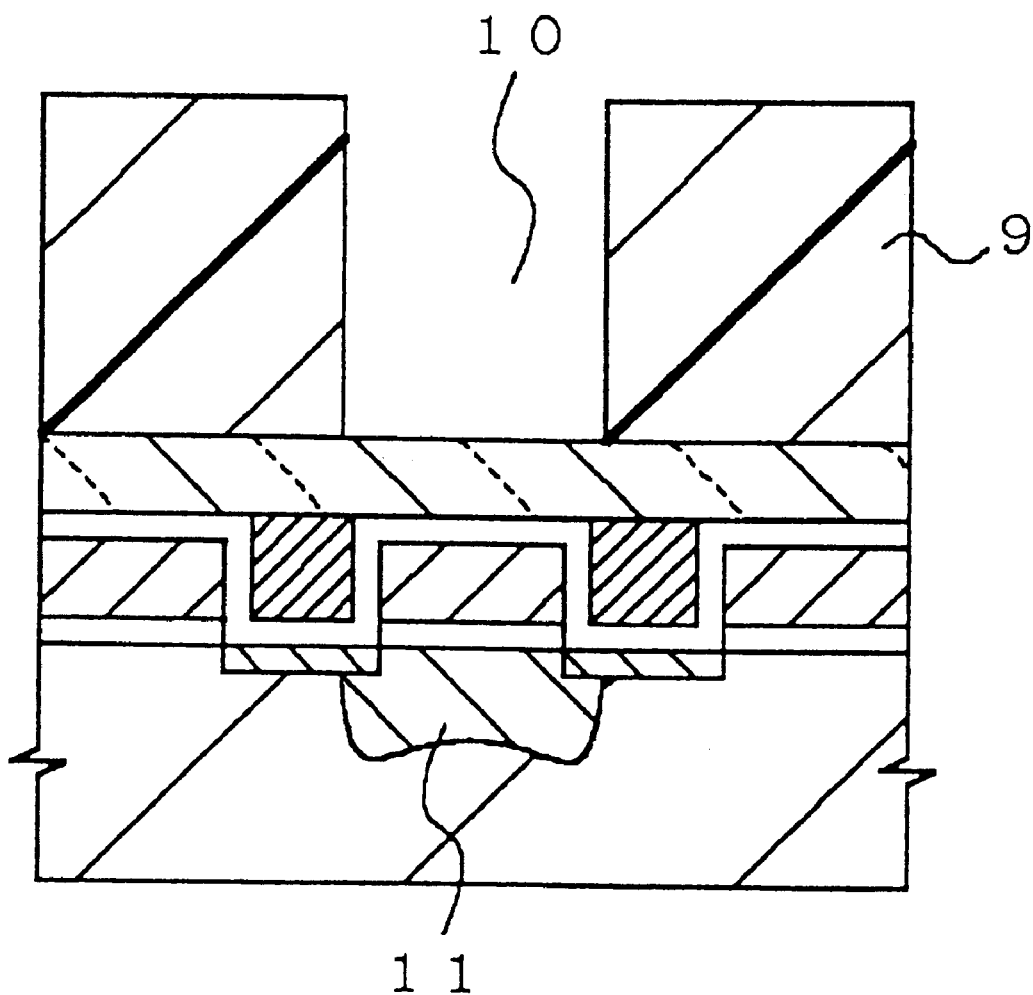

With reference to FIG. 5D, a resist mask 9 is provided over the inter-layer insulator 8, wherein the resist mask 9 has a square-shaped opening 10 which is positioned over a channel region under the gate electrode 4. The resist mask 9 with the square-shaped opening 10 is used as a mask for carrying out the ROM code ion-implantation into a selected and limited region including the channel region under the gate electrode 4 and adjacent regions to the channel region. The ROM code ion-implantation is carried out with boron in a just vertical direction to the planarized surface of the inter-layer insulator 8 at an ion-implantation energy of 200 keV and at a dose of 1E14 $cm^{-2}$. Subsequently, a heat treatment is carried out by a rapid thermal anneal at a temperature of 850° C. for 15 seconds for thermal diffusion to form a ROM code diffusion region 9.

Even if the resist mask 9 having the opening size variation from the designed or intended size is used for carrying out the mask ROM coding ion-implantation to form the ROM code diffusion region 11, the ion-implantation stopper films 7 capture ions of the ion-implantation except for ions to be implanted through the gate electrode 4 into the channel region under the gate electrode 4 as well as through the passivation film 5 on side walls of the gate electrode 4 to adjacent regions to the channel region, whereby the ion-implantation stopper films 7 prevent ions from passing through the ion-implantation stopper films 7 and reach the stripe-shaped p-type diffusion regions 6 and upper regions of the semiconductor substrate 1 under the stripe-shaped p-type diffusion regions 6. As a result, the highly accurate positions of the ion-implantation stopper films 7 allow the required highly accurate control to the size in lateral directions of the ROM code diffusion region 11, so that the size in lateral directions of the ROM code diffusion region 11 just Corresponds to the designed or intended size even enlargement in size of the opening 10 of the resist mask 9. Even if the variation in size of the opening 10 of the resist mask 9 is not so small, then the ROM code diffusion region 11 extends but only in the channel region under the gate electrode 4 and adjacent regions to the channel region. Substantially no ions are, however, implanted under the adjacent channel region under the adjacent gate electrode 4, whereby the threshold voltage of the MOS field effect transistor has substantially no variation from the designed or intended value.

Further, in the mask ROM code ion-implantation process, the ions pass through the inter-layer insulator 8 and also through the gate electrode 4, during which the ions are scattered by atoms of the inter-layer insulator 8 and the gate electrode 4. The scattered ions are, however, captured into the ion-implantation stopper films 7 and thus are prevented from passing or penetrating through the ion-implantation stopper films 7 to the regions around the channel region under the gate electrode 4 positioned under the opening 10 of the resist mask 9. Substantially no ions are, however, implanted under the adjacent channel region under the adjacent gate electrode 4, whereby the threshold voltage of the MOS field effect transistor has substantially no variation from the designed or intended value.

The mask ROM code ion-implantation method by use of the ion-implantation stopper films 7 makes the memory cell structure free from the conventional problems in excess enlargement in the lateral direction of the size of the ROM code diffusion regions or in the excess extension of the ROM code diffusion regions to the adjacent channel region of the adjacent MOS field effect transistor of the adjacent memory cell. This makes it possible to realize the required increase in density of the integration of the mask programmable read only memory device.

For the above novel mask ROM code ion-implantation method by use of the ion-implantation stopper films 7, it is unnecessary to reduce the variation in size of the openings of the resist mask to be used for carrying out the mask ROM code ion-implantation to form the ROM code diffusion region 11. Any extremely high accuracy in photolithography technique is not required which is, however, extremely expensive. This makes it possible to reduce the manufacturing cost of the mask programmable read only memory device.

The above novel mask ROM code ion-implantation method by use of the ion-implantation stopper films 7 is suitable for preventing any substantive expansion in lateral directions of the ROM code diffusion region.

The above novel mask ROM code ion-implantation method by use of the ion-implantation stopper films 7 is also suitable for preventing any substantive variation in threshold voltage of the MOS field effect transistor.

The above novel mask ROM code ion-implantation method by use of the ion-implantation stopper films 7 is also suitable for allowing the semiconductor memory device such as the mask programmable read only memory to be scaled down.

The above novel mask ROM code ion-implantation method by use of the ion-implantation stopper films 7 is also suitable for allowing increase in density of integration of the semiconductor memory device such as the mask programmable read only memory.

The above novel mask ROM code ion-implantation method by use of the ion-implantation stopper films 7 is also suitable for allowing increase in memory capacity of the semiconductor memory device such as the mask programmable read only memory.

The above novel mask ROM code ion-implantation method by use of the ion-implantation stopper films 7 is also suitable for allowing a possible reduction in manufacturing cost of the semiconductor memory device such as the mask programmable read only memory.

In this embodiment, the novel memory cell structure with the ion-implantation stopper films and the novel mask ROM code ion-implantation method by use of the ion-implantation stopper films are applied to the mask programmable read only memory. Notwithstanding, the novel memory cell structure with the ion-implantation stopper films and the novel mask ROM code ion-implantation method by use of the ion-implantation stopper films are also applicable to any other structure having an electrode electrically isolated from the semiconductor substrate and also having an impurity doped region including the channel region under the gate electrode for a threshold voltage control.

Further if the above ion-implantation stopper films are made of an electrically conductive material, then it is possible to fix the ion-implantation stopper films at the ground potential so as to obtain an electrical stability of the mask programmable read only memory.

Second Embodiment

Figure 6A:
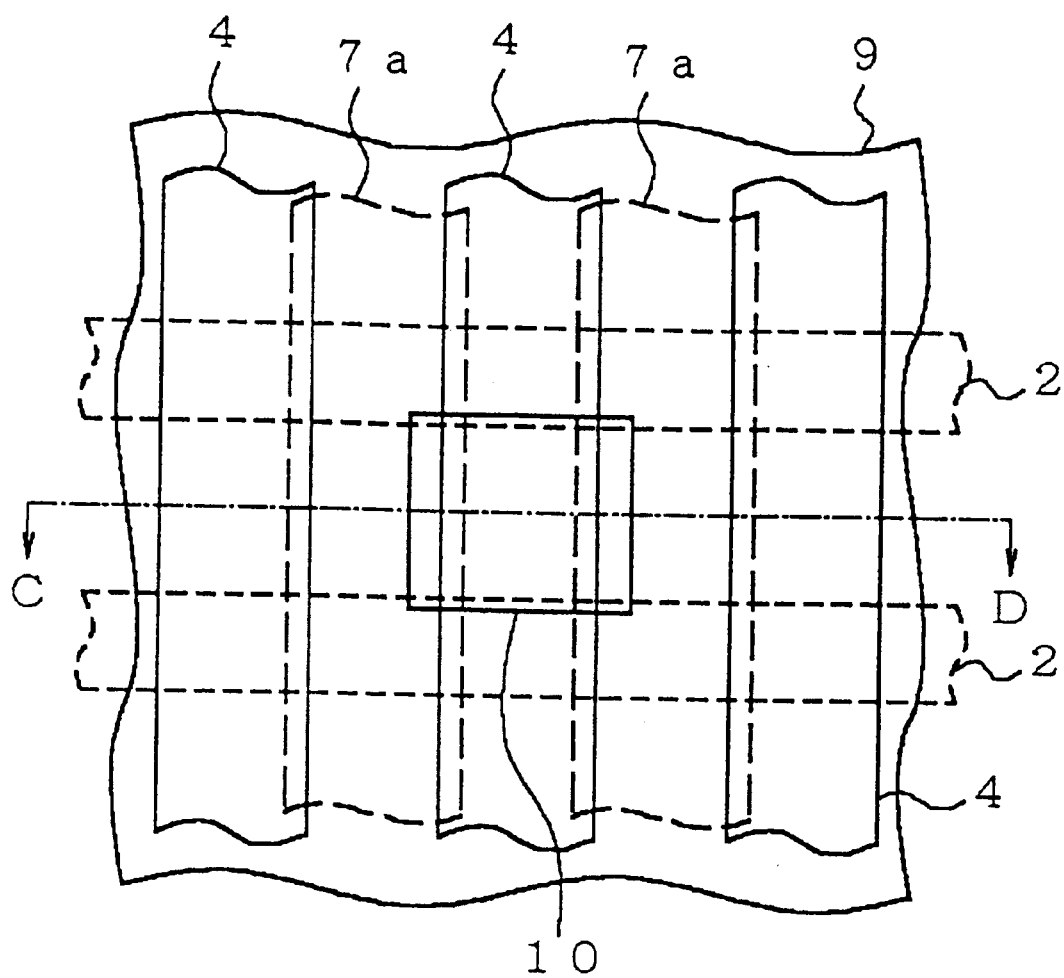
FIG. 6A is a fragmentary plane view illustrative of a novel memory cell structure having a single MOS field effect transistor in a mask programmable read only memory device in second embodiment in accordance with the present invention.
Figure 6B:
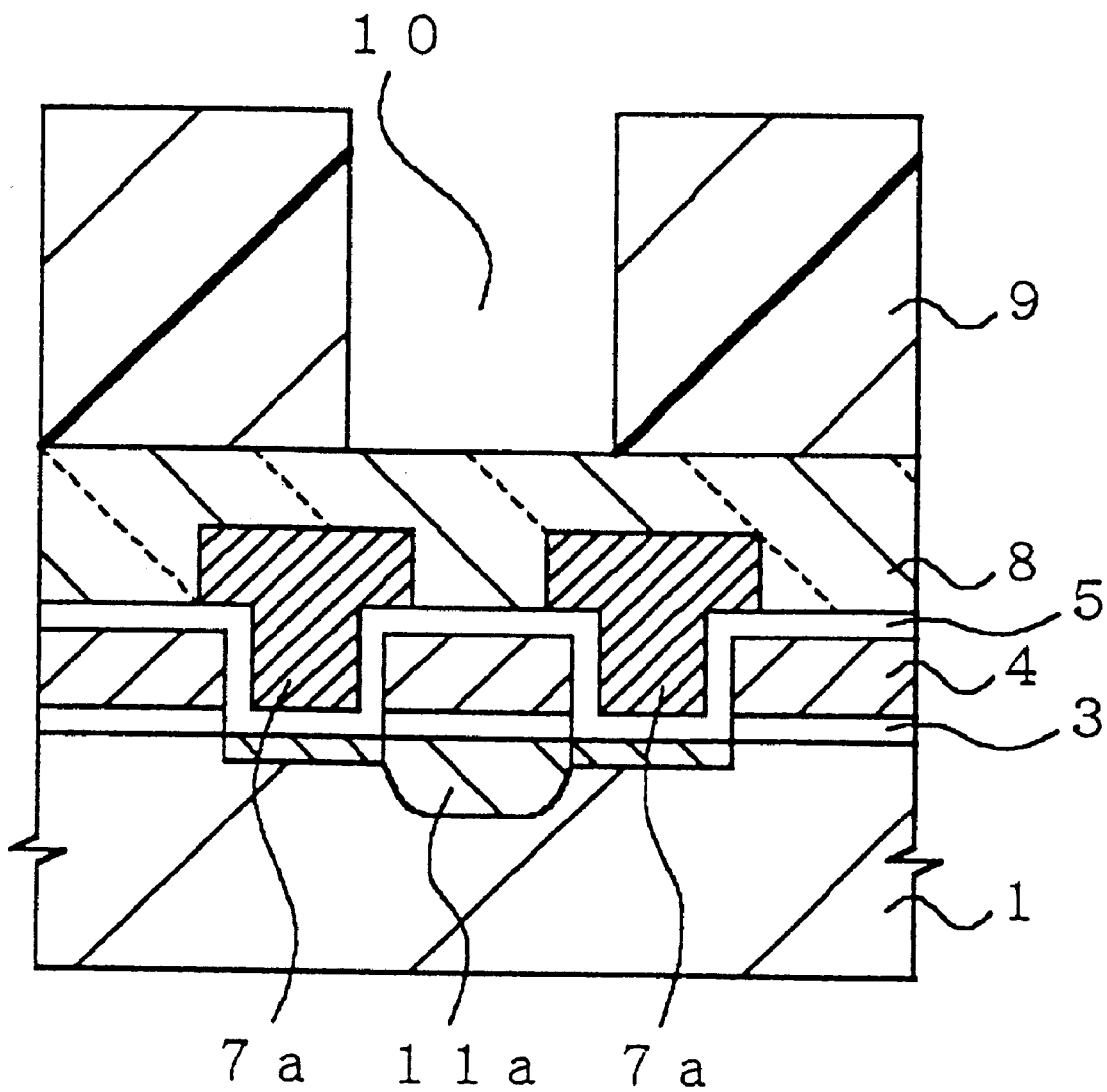
FIG. 6B is a fragmentary cross sectional elevation view illustrative of a novel memory cell structure having a single MOS field effect transistor in a mask programmable read only memory device in second embodiment in accordance with the present invention taken along a C-D line of FIG. 6A.

A second embodiment according to the present invention will be described in detail with reference to the drawings. FIG. 6A is a fragmentary plane view illustrative of a novel memory cell structure having a single MOS field effect transistor in a mask programmable read only memory device. FIG. 6B is a fragmentary cross sectional elevation view illustrative of a novel memory cell structure having a single MOS field effect transistor in a mask programmable read only memory device taken along a C-D line of FIG. 6A. A structural difference of the novel memory cell structure of this embodiment from the first embodiment is in that each of the ion-implantation stopper films 7a extends not only within the aperture defined between the adjacent two of the gate electrodes 4 but also over and in the vicinity of the aperture so that each of the ion-implantation stopper films 7a not only fills the aperture but also extend over the aperture and peripheral portions of the gate electrodes 4, whereby the mask ROM diffusion region 11a extends in the limited region including the channel region defined between the stripe-shaped p-type diffusion regions 6.

The above memory cell structure is formed over a p-type semiconductor substrate 1. A plurality of stripe-shaped n+-type diffusion regions 2 selectively extend in an upper region of the p-type semiconductor substrate 1 so that the stripe-shaped n+-type diffusion regions 2 are aligned at a constant pitch and in parallel to each other, wherein each of the stripe-shaped n+-type diffusion regions 2 has a longitudinal direction along a first direction. A plurality of gate electrodes 4 selectively extend over a gate oxide film 3 so that the gate electrodes 4 are aligned at a constant pitch and in parallel to each other, wherein each of the gate electrodes 4 has a longitudinal direction along a second direction perpendicular to the first direction. A plurality of stripe-shaped p-type diffusion regions 6 selectively extend in the upper region of the p-type semiconductor substrate 1 except under the gate electrodes 4. The stripe-shaped p-type diffusion regions 6 are provided for isolating adjacent two of the stripe-shaped n+-type diffusion regions 2 from each other so that the stripe-shaped p-type diffusion regions 6 are aligned at a constant pitch and in parallel to each other, wherein each of the stripe-shaped p-type diffusion regions 6 has a longitudinal direction along the second direction. A passivation film 5 entirely extends on the stripe-shaped p-type diffusion regions 6 as well as extends on side walls of top surfaces of the gate electrodes 4.

A plurality of ion-implantation stopper films 7a are also provided. Each of the ion-implantation stopper films 7a extends not only within the aperture defined between the adjacent two of the gate electrodes 4 but also over and in the vicinity of the aperture so that each of the ion-implantation stopper films 7a not only fills the aperture but also extend over the aperture and peripheral portions of the gate electrodes 4. The ion-implantation stopper films 7a are aligned at a constant pitch and in parallel to each other and also parallel to the gate electrodes 4, wherein each of the ion-implantation stopper films 7a has a longitudinal direction along the second direction. Each of the ion-implantation stopper films 7a is separated by the passivation film 5 from the adjacent ones of the gate electrodes 4. A distance between the ion-implantation stopper film 7a and the adjacent gate electrode 4 corresponds to a thickness of the passivation film 5. The ion-implantation stopper films 7a cover opposite edge portions of the gate electrodes 4. The ion-implantation stopper films 7a serve as ion-implantation stopper in a mask ROM code ion-implantation process to form a ROM code diffusion region in a channel region of the MOS field effect transistor for controlling a threshold voltage of the MOS field effect transistor. The ion-implantation stopper films 7a are made of a material which is capable of preventing ions from penetrating through the ion-implantation stopper films 7a and reaching upper regions of the semiconductor substrate 1 under the stripe-shaped p-type diffusion regions 6. The ion-implantation stopper films 7a may be made of insulation or conductive materials, provided that the material is capable of preventing ions from penetrating through the ion-implantation stopper films 7a and reaching upper regions of the semiconductor substrate 1 under the stripe-shaped p-type diffusion regions 6. If the material for the ion-implantation stopper films 7a comprises one or more elements having a large mass number, then the function as the ion-implantation stopper is high. For example, if the material for the ion-implantation stopper films 7a comprises an insulation material, a metal oxide is preferable. Further, the parasitic capacitance between adjacent two of the gate electrodes 4 results in delay in operational speed of the mask programmable read only memory or deterioration in high speed performances of the mask programmable read only memory, for which reason it is also preferable that the material for the ion-implantation stopper films 7a has a low dielectric constant so as to reduce a parasitic capacitance between adjacent two of the gate electrodes 4, thereby preventing any substantive delay in operational speed of the mask programmable read only memory due to the parasitic capacitance. A ROM code diffusion region 11a is also provided for increasing a threshold voltage of the MOS field effect transistor. The ROM code diffusion region 11a extends but only under the gate electrode 4 or only in the channel region. The provision of the ion-implantation stopper films 7a makes it possible to limit the ROM code diffusion region 11 into the channel region under the gate electrode 4. No expansion in the lateral direction of the ROM code diffusion region 11, however, causes no variation in threshold voltage from the intended or designed value.

An inter-layer insulator 8 extends entirely over the ion-implantation stopper films 7a and the passivation film 5. A resist mask 9 is provided over the inter-layer insulator 8, wherein the resist mask 9 has a square-shaped opening 10 which is positioned over the gate electrode 4 which is positioned over the channel region. The resist mask 9 with the square-shaped opening 10 is used as a mask for carrying out the ROM code ion-implantation to form a ROM code diffusion region 11a. This ROM code diffusion region 11a extends in a selected upper region of the semiconductor substrate 1 and extends under the gate electrode 4.

The provision of the ion-implantation stopper films 7a makes the memory cell of the mask programmable read only memory free from the problems as engaged with the conventional techniques as described above. It is difficult to prevent any variation in density of the patterns of the openings of the resist mask 9 to be used for the mask ROM coding ion-implantation. The variation in density of the patterns of the openings 10 of the resist mask 9 causes a substantive variation in size of the openings 10 of the resist mask 9. The size of the opening 10 in the high density region, in which the density of the openings 9 is higher than the other region, is likely to be larger than the designed or intended size, if the size of the opening 10 in the low density region, in which the density of the openings 10 is lower than the other region, corresponds to the designed or intended side.

However, in accordance with the present invention, the provision of the ion-implantation stopper films 7a makes the mask programmable read only memory free from the problems due to the variation in size of the openings of the resist mask. Even if the resist mask 9 having the opening size variation from the designed or intended size is used for carrying out the mask ROM coding ion-implantation to form the ROM code diffusion region 11a, the ion-implantation stopper films 7a capture ions of the ion-implantation except for ions to be implanted into the channel region through the gate electrode 4 except for the edged portions thereof, whereby the ion-implantation stopper films 7a prevent ions from passing through the ion-implantation stopper films 7a and reach the stripe-shaped p-type diffusion regions 6 and upper regions of the semiconductor substrate 1 under the stripe-shaped p-type diffusion regions 6. As a result, the highly accurate positions of the ion-implantation stopper films 7a allow the required highly accurate control to the size in lateral directions of the ROM code diffusion region 11a, so that the size in lateral directions of the ROM code diffusion region 11a just corresponds to the designed or intended size even enlargement in size of the opening 10 of the resist mask 9. Even if the variation in size of the opening 10 of the resist mask 9 is not so small, then the ROM code diffusion region 11a extends but only in the channel region under the gate electrode 4. Substantially no ions are, however, implanted under the adjacent channel region under the adjacent gate electrode 4, whereby the threshold voltage of the MOS field effect transistor has substantially no variation from the designed or intended value.

Further, in the mask ROM code ion-implantation process, the ions pass through the inter-layer insulator 8 and also through the gate electrode 4, during which the ions are scattered by atoms of the inter-layer insulator 8 and the gate electrode 4. The scattered ions are, however, captured into the ion-implantation stopper films 7a and thus are prevented from passing or penetrating through the ion-implantation stopper films 7a to the regions around the channel region under the gate electrode 4 positioned under the opening 10 of the resist mask 9. Substantially no ions are, however, implanted under the adjacent channel region under the adjacent gate electrode 4, whereby the threshold voltage of the MOS field effect transistor has substantially no variation from the designed or intended value.

The provision of the ion-implantation stopper films 7a makes the memory cell structure free from the conventional problems in excess enlargement in the lateral direction of the size of the ROM code diffusion regions or in the excess extension of the ROM code diffusion regions to the adjacent channel region of the adjacent MOS field effect transistor of the adjacent memory cell. This makes it possible to realize the required increase in density of the integration of the mask programmable read only memory device.

It is unnecessary for the above novel structure to reduce the variation in size of the openings of the resist mask to be used for carrying out the mask ROM code ion-implantation to form the ROM code diffusion region 11a. Any extremely high accuracy in photo-lithography technique is not required which is, however, extremely expensive. This makes it possible to reduce the manufacturing cost of the mask programmable read only memory device.

The above novel memory cell structure having the single MOS field effect transistor with the ion-implantation stopper films 7a is suitable for preventing any substantive expansion in lateral directions of the ROM code diffusion region.

The above novel memory cell structure having the single MOS field effect transistor with the ion-implantation stopper films 7a is also suitable for preventing any substantive variation in threshold voltage of the MOS field effect transistor.

The above novel memory cell structure having the single MOS field effect transistor with the ion-implantation stopper films 7a is also suitable for allowing the semiconductor memory device such as the mask programmable read only memory to be scaled down.

The above novel memory cell structure having the single MOS field effect transistor with the ion-implantation stopper films 7a is also suitable for allowing increase in density of integration of the semiconductor memory device such as the mask programmable read only memory.

The above novel memory cell structure having the single MOS field effect transistor with the ion-implantation stopper films 7a is also suitable for allowing increase in memory capacity of the semiconductor memory device such as the mask programmable read only memory.

The above novel memory cell structure having the single MOS field effect transistor with the ion-implantation stopper films 7a is also suitable for allowing a possible reduction in manufacturing cost of the semiconductor memory device such as the mask programmable read only memory.

In this embodiment, the novel memory cell structure with the ion-implantation stopper films and the novel mask ROM code ion-implantation method by use of the ion-implantation stopper films are applied to the mask programmable read only memory. Notwithstanding, the novel memory cell structure with the ion-implantation stopper films and the novel mask ROM code ion-implantation method by use of the ion-implantation stopper films are also applicable to any other structure having an electrode electrically isolated from the semiconductor substrate and also having an impurity doped region including the channel region under the gate electrode for a threshold voltage control.

Further if the above ion-implantation stopper films are made of an electrically conductive material, then it is possible to fix the ion-implantation stopper films at the ground potential so as to obtain an electrical stability of the mask programmable read only memory.

Third Embodiment

Figure 7A:
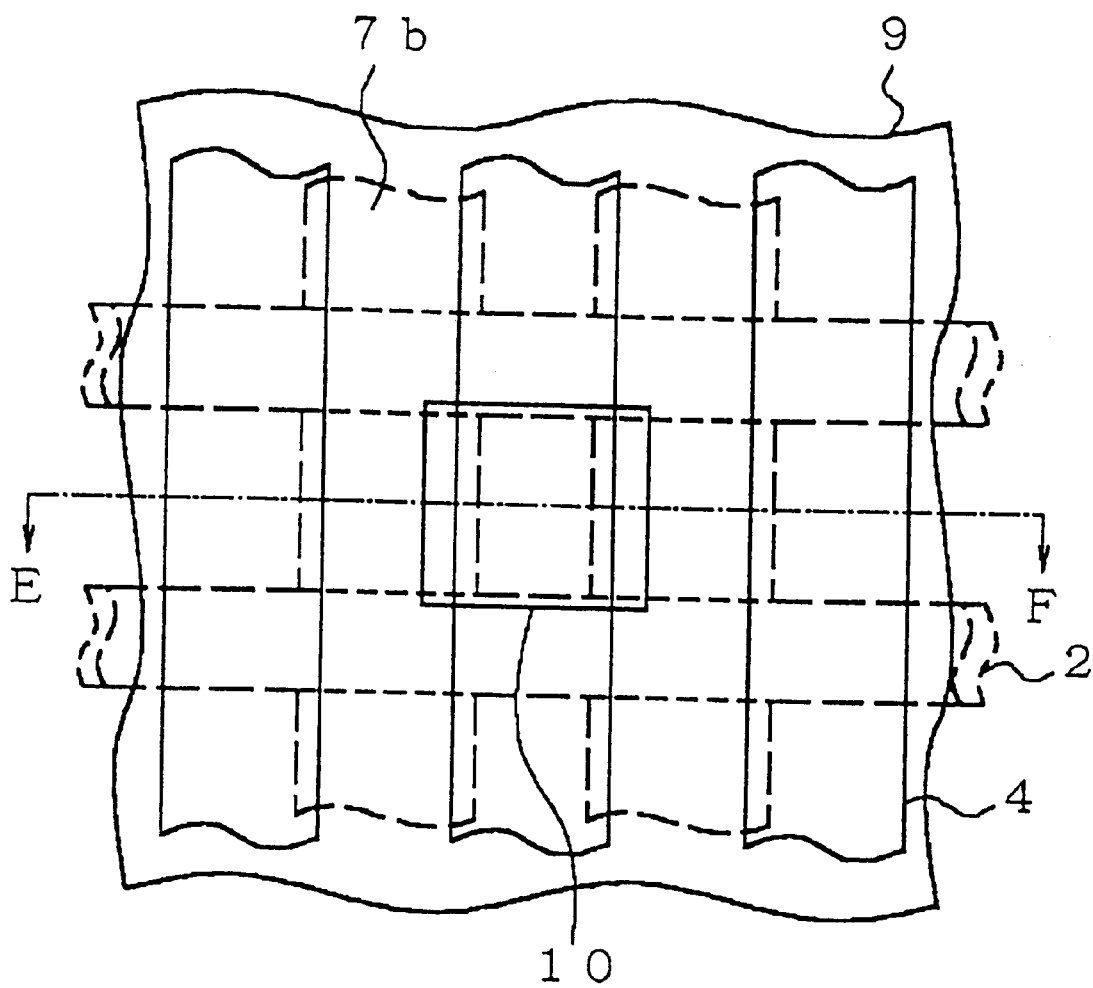
FIG. 7A is a fragmentary plane view illustrative of a novel memory cell structure having a single MOS field effect transistor in a mask programmable read only memory device in third embodiment in accordance with the present invention.
Figure 7B:
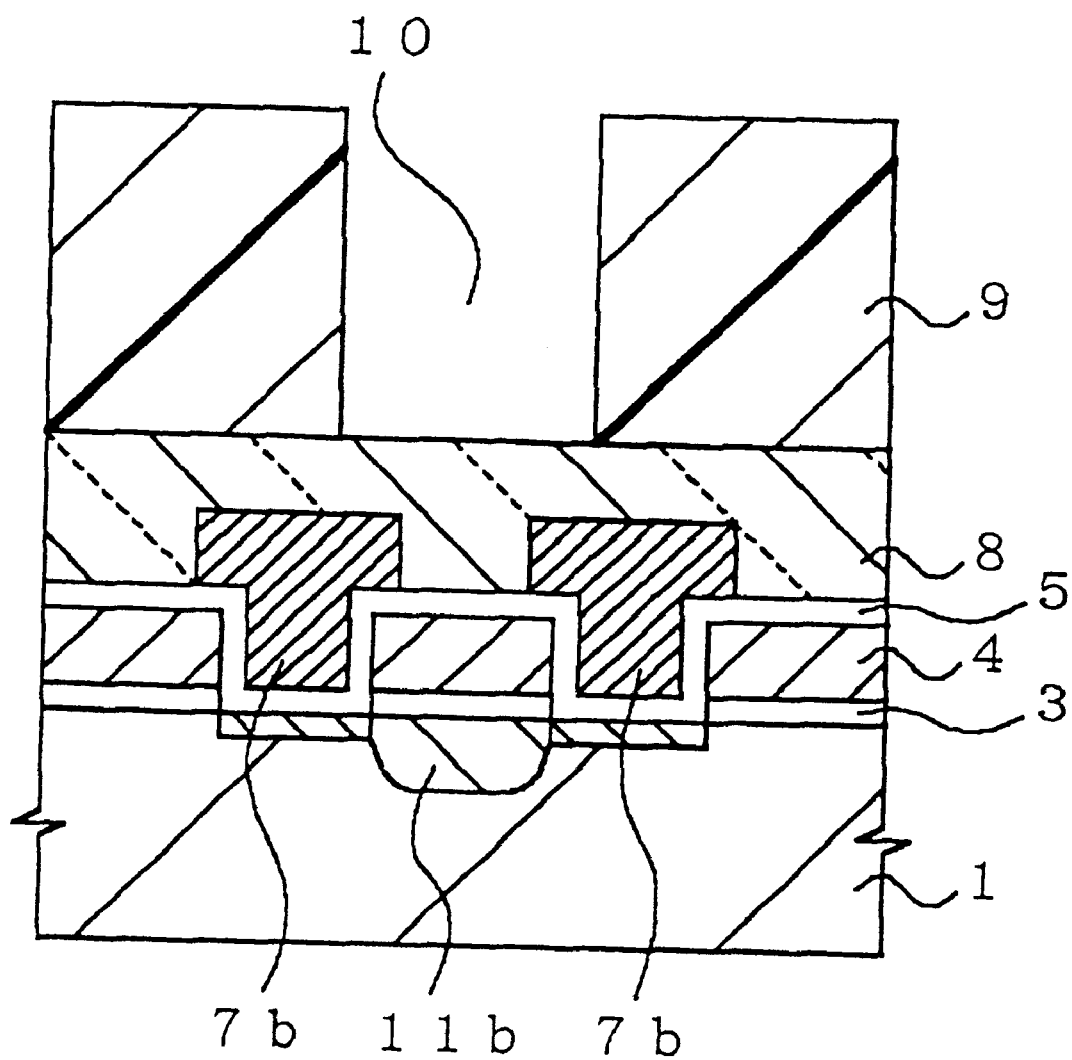
FIG. 7B is a fragmentary cross sectional elevation view illustrative of a novel memory cell structure having a single MOS field effect transistor in a mask programmable read only memory device in third embodiment in accordance with the present invention taken along an E-F line of FIG. 7A.

A third embodiment according to the present invention will be described in detail with reference to the drawings. FIG. 7A is a fragmentary plane view illustrative of a novel memory cell structure having a single MOS field effect transistor in a mask programmable read only memory device. FIG. 7B is a fragmentary cross sectional elevation view illustrative of a novel memory cell structure having a single MOS field effect transistor in a mask programmable read only memory device taken along an E-F line of FIG. 7A. A structural difference of the novel memory cell structure of this embodiment from the second embodiment is in that a plurality of the ion-implantation stopper films 7b are provided throughout the memory cell arrays of the mask programmable read only memory device.

The above memory cell structure is formed over a p-type semiconductor substrate 1. A plurality of stripe-shaped n+-type diffusion regions 2 selectively extend in an upper region of the p-type semiconductor substrate 1 so that the stripe-shaped n+-type diffusion regions 2 are aligned at a constant pitch and in parallel to each other, wherein each of the stripe-shaped n+-type diffusion regions 2 has a longitudinal direction along a first direction. A plurality of gate electrodes 4 selectively extend over a gate oxide film 3 so that the gate electrodes 4 are aligned at a constant pitch and in parallel to each other, wherein each of the gate electrodes 4 has a longitudinal direction along a second direction perpendicular to the first direction. A plurality of stripe-shaped p-type diffusion regions 6 selectively extend in the upper region of the p-type semiconductor substrate 1 except under the gate electrodes 4. The stripe-shaped p-type diffusion regions 6 are provided for isolating adjacent two of the stripe-shaped n+-type diffusion regions 2 from each other so that the stripe-shaped p-type diffusion regions 6 are aligned at a constant pitch and in parallel to each other, wherein each of the stripe-shaped p-type diffusion regions 6 has a longitudinal direction along the second direction. A passivation film 5 entirely extends on the stripe-shaped p-type diffusion regions 6 as well as extends on side walls of top surfaces of the gate electrodes 4.

A plurality of ion-implantation stopper films 7b are also provided throughout the memory cell arrays of the mask programmable read only memory device- Each of the ion-implantation stopper films 7b extends not only within the aperture defined between the adjacent two of the gate electrodes 4 but also over and in the vicinity of the aperture so that each of the ion-implantation stopper films 7b not only fills the aperture but also extend over the aperture and peripheral portions of the gate electrodes 4. The ion-implantation stopper films 7b are aligned at a constant pitch and in parallel to each other and also parallel to the gate electrodes 4, wherein each of the ion-implantation stopper films 7b has a longitudinal direction along the second direction. Each of the ion-implantation stopper films 7b is separated by the passivation film 5 from the adjacent ones of the gate electrodes 4. A distance between the ion-implantation stopper film 7b and the adjacent gate electrode 4 corresponds to a thickness of the passivation film 5. The ion-implantation stopper films 7b cover opposite edge portions of the gate electrodes 4. The ion-implantation stopper films 7b serve as ion-implantation stopper in a mask ROM code ion-implantation process to form a ROM code diffusion region in a channel region of the MOS field effect transistor for controlling a threshold voltage of the MOS field effect transistor. The ion-implantation stopper films 7b are made of a material which is capable of preventing ions from penetrating through the ion-implantation stopper films 7b and reaching upper regions of the semiconductor substrate 1 under the stripe-shaped p-type diffusion regions 6. The ion-implantation stopper films 7b may be made of insulation or conductive materials, provided that the material is capable of preventing ions from penetrating through the ion-implantation stopper films 7b and reaching upper regions of the semiconductor substrate 1 under the stripe-shaped p-type diffusion regions 6 If the material for the ion-implantation stopper films 7b comprises one or more elements having a large mass number, then the function as the ion-implantation stopper is high. For example, if the material for the ion-implantation stopper films 7b comprises an insulation material, a metal oxide is preferable. Further, the parasitic capacitance between adjacent two of the gate electrodes 4 results in delay in operational speed of the mask programmable read only memory or deterioration in high speed performances of the mask programmable read only memory, for which reason it is also preferable that the material for the ion-implantation stopper films 7b has a low dielectric constant so as to reduce a parasitic capacitance between adjacent two of the gate electrodes 4, thereby preventing any substantive delay in operational speed of the mask programmable read only memory due to the parasitic capacitance. A ROM code diffusion region 11b is also provided for increasing a threshold voltage of the MOS field effect transistor. The ROM code diffusion region 11b extends but only under the gate electrode 4 or only in the channel region. The provision of the ion-implantation stopper films 7b makes it possible to limit the ROM code diffusion region 11 into the channel region under the gate electrode 4. No expansion in the lateral direction of the ROM code diffusion region 11, however, causes no variation in threshold voltage from the intended or designed value.

An inter-layer insulator 8 extends entirely over the ion-implantation stopper films 7b and the passivation film 5. A resist mask 9 is provided over the inter-layer insulator 8, wherein the resist mask 9 has a square-shaped opening 10 which is positioned over the gate electrode 4 which is positioned over the channel region. The resist mask 9 with the square-shaped opening 10 is used as a mask for carrying out the ROM code ion-implantation to form a ROM code diffusion region 11b. This ROM code diffusion region 11b extends in a selected upper region of the semiconductor substrate 1 and extends under the gate electrode 4.

The provision of the ion-implantation stopper films 7b makes the memory cell of the mask programmable read only memory free from the problems as engaged with the conventional techniques as described above. It is difficult to prevent any variation in density of the patterns of the openings of the resist mask 9 to be used for the mask ROM coding ion-implantation. The variation in density of the patterns of the openings 10 of the resist mask 9 causes a substantive variation in size of the openings 10 of the resist mask 9. Tic size of the opening 10 in the high density region, in which the density of the openings 9 is higher than the other region, is likely to be larger than the designed or intended size, if the size of the opening 10 in the low density region, in which the density of the openings 10 is lower than the other region, corresponds to the designed or intended side.

However, in accordance with the present invention, the provision of the ion-implantation stopper films 7b makes the mask programmable read only memory free from the problems due to the variation in size of the openings of the resist mask. Even if the resist mask 9 having the opening size variation from the designed or intended size is used for carrying out the mask ROM coding ion-implantation to form the ROM code diffusion region 11b, the ion-implantation stopper films 7b capture ions of the ion-implantation except for ions to be implanted into the channel region through the gate electrode 4 except for the edged portions thereof, whereby the ion-implantation stopper films 7b prevent ions from passing through the ion-implantation stopper films 7b and reach the stripe-shaped p-type diffusion regions 6 and upper regions of the semiconductor substrate 1 under the stripe-shaped p-type diffusion regions 6. As a result, the highly accurate positions of the ion-implantation stopper films 7b allow the required highly accurate control to the size in lateral directions of the ROM code diffusion region 11b, so that the size in lateral directions of the ROM code diffusion region 11b just corresponds to the designed or intended size even enlargement in size of the opening 10 of the resist mask 9. Even if the variation in size of the opening 10 of the resist mask 9 is not so small, then the ROM code diffusion region 11b extends but only in the channel region under the gate electrode 4. Substantially no ions are, however, implanted under the adjacent channel region under the adjacent gate electrode 4, whereby the threshold voltage of the MOS field effect transistor has substantially no variation from the designed or intended value.

Further, in the mask ROM code ion-implantation process, the ions pass through the inter-layer insulator 8 and also through the gate electrode 4, during which the ions are scattered by atoms of the inter-layer insulator 8 and the gate electrode 4. The scattered ions are, however, captured into the ion-implantation stopper films 7b and thus are prevented from passing or penetrating through the ion-implantation stopper films 7b to the regions around the channel region under the gate electrode 4 positioned under the opening 10 of the resist mask 9. Substantially no ions are, however, implanted under the adjacent channel region under the adjacent gate electrode 4, whereby the threshold voltage of the MOS field effect transistor has substantially no variation from the designed or intended value.

The provision of the ion-implantation stopper films 7b makes the memory cell structure free from the conventional problems in excess enlargement in the lateral direction of the size of the ROM code diffusion regions or in the excess extension of the ROM code diffusion regions to the adjacent channel region of the adjacent MOS field effect transistor of the adjacent memory cell. This makes it possible to realize the, required increase in density of the integration of the mask programmable read only memory device.

It is unnecessary for the above novel structure to reduce the variation in size of the openings of the resist mask to be used for carrying out the mask ROM code ion-implantation to form the ROM code diffusion region 11b. Any extremely high accuracy in photo-lithography technique is not required which is, however, extremely expensive. This makes it possible to reduce the manufacturing cost of the mask programmable read only memory device.

The above novel memory cell structure having the single MOS field effect transistor with the ion-implantation stopper films 7b is suitable for preventing any substantive expansion in lateral directions of the ROM code diffusion region.

The above novel memory cell structure having the single MOS field effect transistor with the ion-implantation stopper films 7b is also suitable for preventing any substantive variation in threshold voltage of the MOS field effect transistor.

The above novel memory cell structure having the single MOS field effect transistor with the ion-implantation stopper films 7b is also suitable for allowing the semiconductor memory device such as the mask programmable read only memory to be scaled down.

The above novel memory cell structure having the single MOS field effect transistor with the ion-implantation stopper films 7b is also suitable for allowing increase in density of integration of the semiconductor memory device such as the mask programmable read only memory.

The above novel memory cell structure having the single MOS field effect transistor with the ion-implantation stopper films 7b is also suitable for allowing increase in memory capacity of the semiconductor memory device such as the mask programmable read only memory.

The above novel memory cell structure having the single MOS field effect transistor with the ion-implantation stopper films 7b is also suitable for allowing a possible reduction in manufacturing cost of the semiconductor memory device such as the mask programmable read only memory.

In this embodiment, the novel memory cell structure with the ion-implantation stopper films and the novel mask ROM code ion-implantation method by use of the ion-implantation stopper films are applied to the mask programmable read only memory. Notwithstanding, the novel memory cell structure with the ion-implantation stopper films and the novel mask ROM code ion-implantation method by use of the ion-implantation stopper films are also applicable to any other structure having an electrode electrically isolated from the semiconductor substrate and also having an impurity doped region including the channel region under the gate electrode for a threshold voltage control.

Further if the above ion-implantation stopper films are made of an electrically conductive material, then it is possible to fix the ion-implantation stopper films at the ground potential so as to obtain an electrical stability of the mask programmable read only memory.

Fourth Embodiment

Figure 8A:
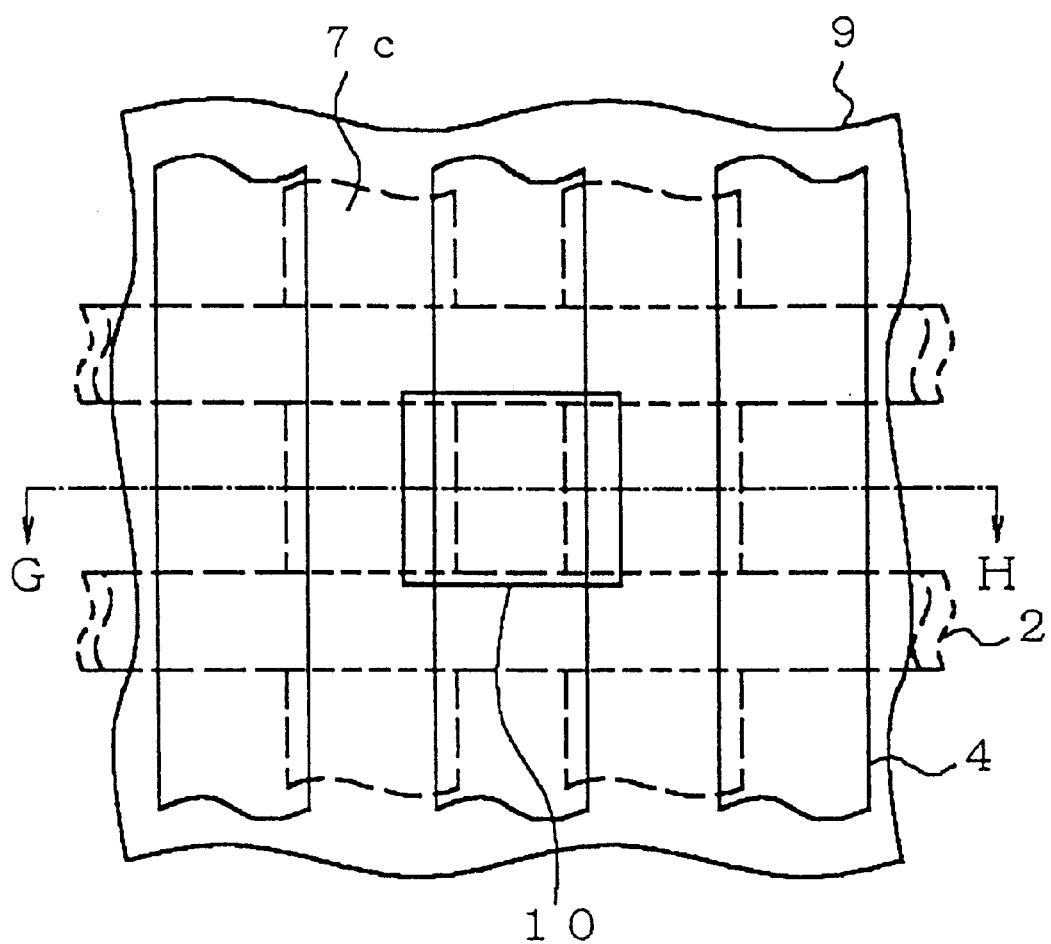
FIG. 8A is a fragmentary plane view illustrative of a novel memory cell structure having a single MOS field effect transistor in a mask programmable read only memory device in fourth embodiment in accordance with the present invention.
Figure 8B:
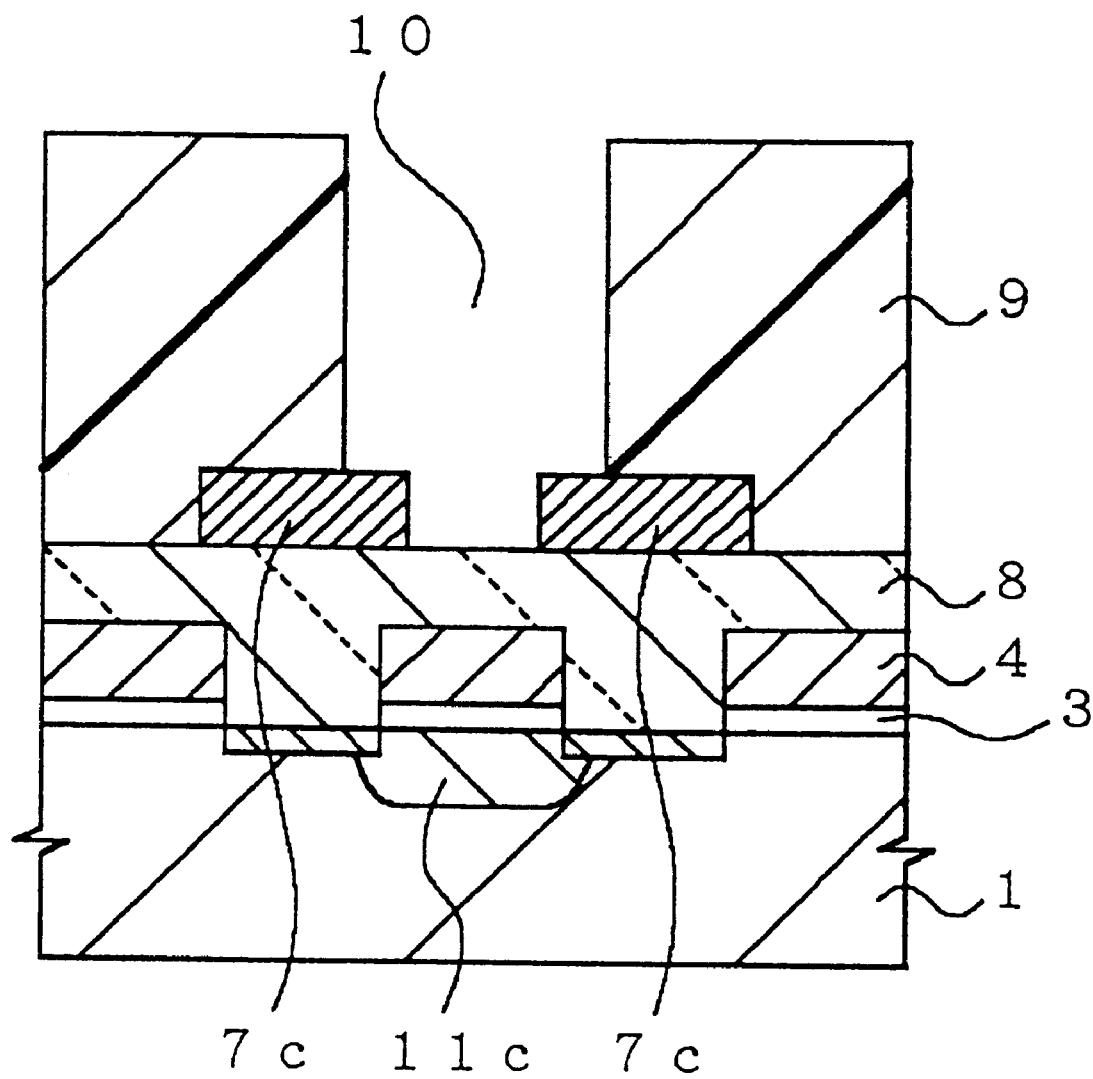
FIG. 8B is a fragmentary cross sectional elevation view illustrative of a novel memory cell structure having a single MOS field effect transistor in a mask programmable read only memory device in fourth embodiment in accordance with the present invention taken along a G-H line of FIG. 8A.

A fourth embodiment according to the present invention will be described in detail with reference to the drawings. FIG. 8A is a fragmentary plane view illustrative of a novel memory cell structure having a single MOS field effect transistor in a mask programmable read only memory device. FIG. 8B is a fragmentary cross sectional elevation view illustrative of a novel memory cell structure having a single MOS field effect transistor in a mask programmable read only memory device taken along a G-H line of FIG. 8A. A structural difference of the novel memory cell structure of this embodiment from the second embodiment is in that each of the ion-implantation stopper films 7c extends over the inter-layer insulator 8 so that each of the ion-implantation stopper films 7c covers the aperture defined between the adjacent two of the gate electrodes 4 and also cover edge portions of the gate electrodes 4. In place of the ion-implantation stopper films 7c, the inter-layer insulator 8 fills the apertures defined between the gate electrodes 4.

The above memory cell structure is formed over a p-type semiconductor substrate 1. A plurality of stripe-shaped n+-type diffusion regions 2 selectively extend in an upper region of the p-type semiconductor substrate 1 so that the stripe-shaped n+-type diffusion regions 2 are aligned at a constant pitch and in parallel to each other, wherein each of the stripe-shaped n+-type diffusion regions 2 has a longitudinal direction along a first direction. A plurality of gate electrodes 4 selectively extend over a gate oxide film 3 so that the gate electrodes 4 are aligned at a constant pitch and in parallel to each other, wherein each of the gate electrodes 4 has a longitudinal direction along a second direction perpendicular to the first direction. A plurality of stripe-shaped p-type diffusion regions 6 selectively extend in the upper region of the p-type semiconductor substrate 1 except under the gate electrodes 4. The stripe-shaped p-type diffusion regions 6 are provided for isolating adjacent two of the stripe-shaped n+-type diffusion regions 2 from each other so that the stripe-shaped p-type diffusion regions 6 are aligned at a constant pitch and in parallel to each other, wherein each of the stripe-shaped p-type diffusion regions 6 has a longitudinal direction along the second direction. An inter-layer insulator 8 extends entirely over the gate electrodes 4 and within the apertures defined between the gate electrodes 4 so that the inter-layer insulator 8 cover the gate electrodes 4 and fills the apertures defined between the gate electrodes 4.

A plurality of ion-implantation stopper films 7c are also provided throughout the memory cell arrays of the mask programmable read only memory device. Each of the ion-implantation stopper films 7c extends over the inter-layer insulator 8 so that each of the ion-implantation stopper films 7c covers the aperture defined between the adjacent two of the gate electrodes 4 and also cover edge portions of the gate electrodes 4. In place of the ion-implantation stopper films 7c, the inter-layer insulator 8 fills the apertures defined between the gate electrodes 4. The ion-implantation stopper films 7c are aligned at a constant pitch and in parallel to each other and also parallel to the gate electrodes 4, wherein each of the ion-implantation stopper films 7c has a longitudinal direction along the second direction. Each of the ion-implantation stopper films 7c is separated by the inter-layer insulator 8 from the adjacent ones of the gate electrodes 4. The ion-implantation stopper films 7c serve as ion-implantation stopper in a mask ROM code ion-implantation process to form a ROM code diffusion region in a channel region of the MOS field effect transistor for controlling a threshold voltage of the MOS field effect transistor. The ion-implantation stopper films 7c are made of a material which is capable of preventing ions from penetrating through the ion-implantation stopper films 7c and the inter-layer insulator 8 but only within the apertures defined between the gate electrodes 4 also thus prevent the ions from reaching upper regions of the semiconductor substrate 1 under the stripe-shaped p-type diffusion regions 6. The ion-implantation stopper films 7c may be made of insulation or conductive materials, provided that the material is capable of preventing ions from penetrating through the ion-implantation stopper films 7c and reaching upper regions of the semiconductor substrate I under the stripe-shaped p-type diffusion regions 6. If the material for the ion-implantation stopper films 7c comprises one or more elements having a large mass numbers then the function as the ion-implantation stopper is high. For example, if the material for the ion-implantation stopper films 7c comprises an insulation material, a metal oxide is preferable. Further, the parasitic capacitance between adjacent two of the gate electrodes 4 results in delay in operational speed of the mask programmable read only memory or deterioration in high speed performances of the mask programmable read only memory, for which reason it is also preferable that the material for the ion-implantation stopper films 7c has a low dielectric constant so as to reduce a parasitic capacitance between adjacent two of the gate electrodes 4, thereby preventing any substantive delay in operational speed of the mask programmable read only memory due to the parasitic capacitance. A ROM code diffusion region 11c is also provided for increasing a threshold voltage of the MOS field effect transistor. The ROM code diffusion region 11c extends but only under the gate electrode 4 or only in the channel region. The provision of the ion-implantation stopper films 7c makes it possible to limit the ROM code diffusion region 11 into the channel region under the gate electrode 4. No expansion in the lateral direction of the ROM code diffusion region 11c, however, causes no variation in threshold voltage from the intended or designed value.

A resist mask 9 is provided over the inter-layer insulator 8 and the ion-implantation stopper films 7c, wherein the resist mask 9 has a square-shaped opening 10 which is positioned over the gate electrode 4 which is positioned over the channel region, whereby the ion-implantation stopper films 7c and the inter-layer insulator 8 under a gap between the adjacent two of the ion-implantation stopper films 7c are shown through the opening 10 of the resist mask 9. The resist mask 9 with the square-shaped opening 10 is used as a mask for carrying out the ROM code ion-implantation to form a ROM code diffusion region 11c. This ROM code diffusion region 11c extends in a selected upper region of the semiconductor substrate 1 and extends under the gate electrode 4.

The provision of the ion-implantation stopper films 7c makes the memory cell of the mask programmable read only memory free from the problems as engaged with the conventional techniques as described above. It is difficult to prevent any variation in density of the patterns of the openings of the resist mask 9 to be used for the mask ROM coding ion-implantation. The variation in density of the patterns of the openings 10 of the resist mask 9 causes a substantive variation in size of the openings 10 of the resist mask 9. The size of the opening 10 in the high density region, in which the density of the openings 9 is higher than the other region, is likely to be larger than the designed or intended size, if the size of the opening 10 in the low density region, in which the density of the openings 10 is lower than the other region, corresponds to the designed or intended side.

However, in accordance with the present invention, the provision of the ion-implantation stopper films 7c makes the mask programmable read only memory free from the problems due to the variation in size of the openings of the resist mask. Even if the resist mask 9 having the opening size variation from the designed or intended size is used for carrying out the mask ROM coding ion-implantation to form the ROM code diffusion region 11c, the ion-implantation stopper films 7c capture ions of the ion-implantation except for ions to be implanted into the channel region through the gate electrode 4 except for the edged portions thereof, whereby the ion-implantation stopper films 7c prevent ions from passing through the ion-implantation stopper films 7c and reach the stripe-shaped p-type diffusion regions 6 and upper regions of the semiconductor substrate 1 under the stripe-shaped p-type diffusion regions 6. As a result, the highly accurate positions of the ion-implantation stopper films 7c allow the required highly accurate control to the size in lateral directions of the ROM code diffusion region 11c, so that the size in lateral directions of the ROM code diffusion region 11c just corresponds to the designed or intended size even enlargement in size of the opening 10 of the resist mask 9. Even if the variation in size of the opening 10 of the resist mask 9 is not so small, then the ROM code diffusion region 11c extends but only in the channel region under the gate electrode 4. Substantially no ions are, however, implanted under the adjacent channel region under the adjacent gate electrode 4, whereby the threshold voltage of the MOS field effect transistor has substantially no variation from the designed or intended value.

The provision of the ion-implantation stopper films 7c makes the memory cell structure free from the conventional problems in excess enlargement in the lateral direction of the size of the ROM code diffusion regions or in the excess extension of the ROM code diffusion regions to the adjacent channel region of the adjacent MOS field effect transistor of the adjacent memory cell. This makes it possible to realize the required increase in density of the integration of the mask programmable read only memory device.

It is unnecessary for the above novel structure to reduce the variation in size of the openings of the resist mask to be used for carrying out the mask ROM code ion-implantation to form the ROM code diffusion region 11c. Any extremely high accuracy in photo-lithography technique is not required which is, however, extremely expensive. This makes it possible to reduce the manufacturing cost of the mask programmable read only memory device.

The above novel memory cell structure having the single MOS field effect transistor with the ion-implantation stopper films 7c is suitable for preventing any substantive expansion in lateral directions of the ROM code diffusion region.

The above novel memory cell structure having the single MOS field effect transistor with the ion-implantation stopper films 7c is also suitable for preventing any substantive variation in threshold voltage of the MOS field effect transistor.

The above novel memory cell structure having the single MOS field effect transistor with the ion-implantation stopper films 7c is also suitable for allowing the semiconductor memory device such as the mask programmable read only memory to be scaled down.

The above novel memory cell structure having the single MOS field effect transistor with the ion-implantation stopper films 7c is also suitable for allowing increase in density of integration of the semiconductor memory device such as the mask programmable read only memory.

The above novel memory cell structure having the single MOS field effect transistor with the ion-implantation stopper films 7c is also suitable for allowing increase in memory capacity of the semiconductor memory device such as the mask programmable read only memory.

The above novel memory cell structure having the single MOS field effect transistor with the ion-implantation stopper films 7c is also suitable for allowing a possible reduction in manufacturing cost of the semiconductor memory device such as the mask programmable read only memory.

In this embodiment, the novel memory cell structure with the ion-implantation stopper films and the novel mask ROM code ion-implantation method by use of the ion-implantation stopper films are applied to the mask programmable read only memory. Notwithstanding, the novel memory cell structure with the ion-implantation stopper films and the novel mask ROM code ion-implantation method by use of the ion-implantation stopper films are also applicable to any other structure having an electrode electrically isolated from the semiconductor substrate and also having an impurity doped region including the channel region under the gate electrode for a threshold voltage control.

Further if the above ion-implantation stopper films are made of an electrically conductive material, then it is possible to fix the ion-implantation stopper films at the ground potential so as to obtain an electrical stability of the mask programmable read only memory.

Fifth Embodiment

Figure 9A:
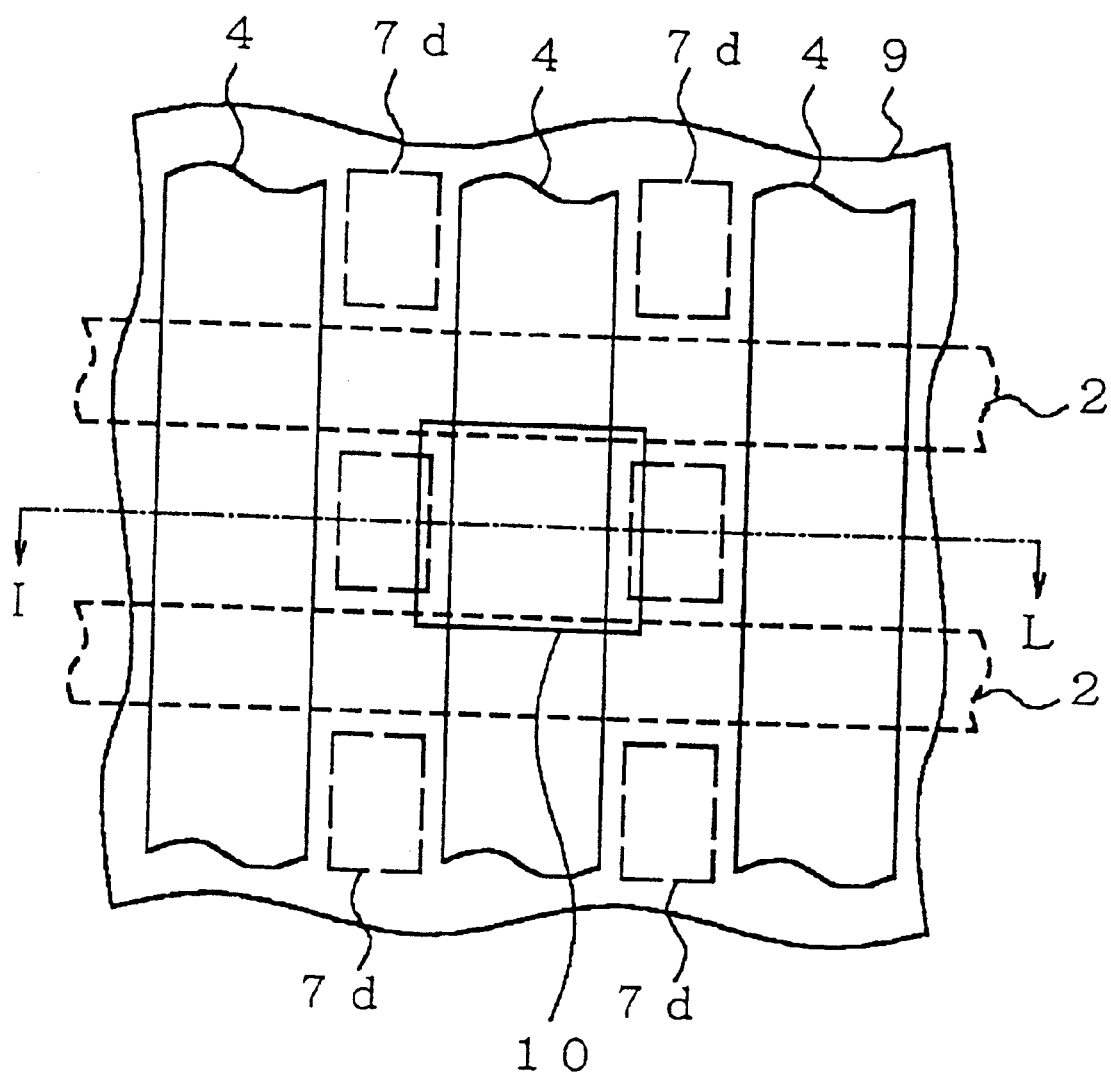
FIG. 9A is a fragmentary plane view illustrative of a novel memory cell structure having a single MOS field effect transistor in a mask programmable read only memory device in fifth embodiment in accordance with the present invention.
Figure 9B:
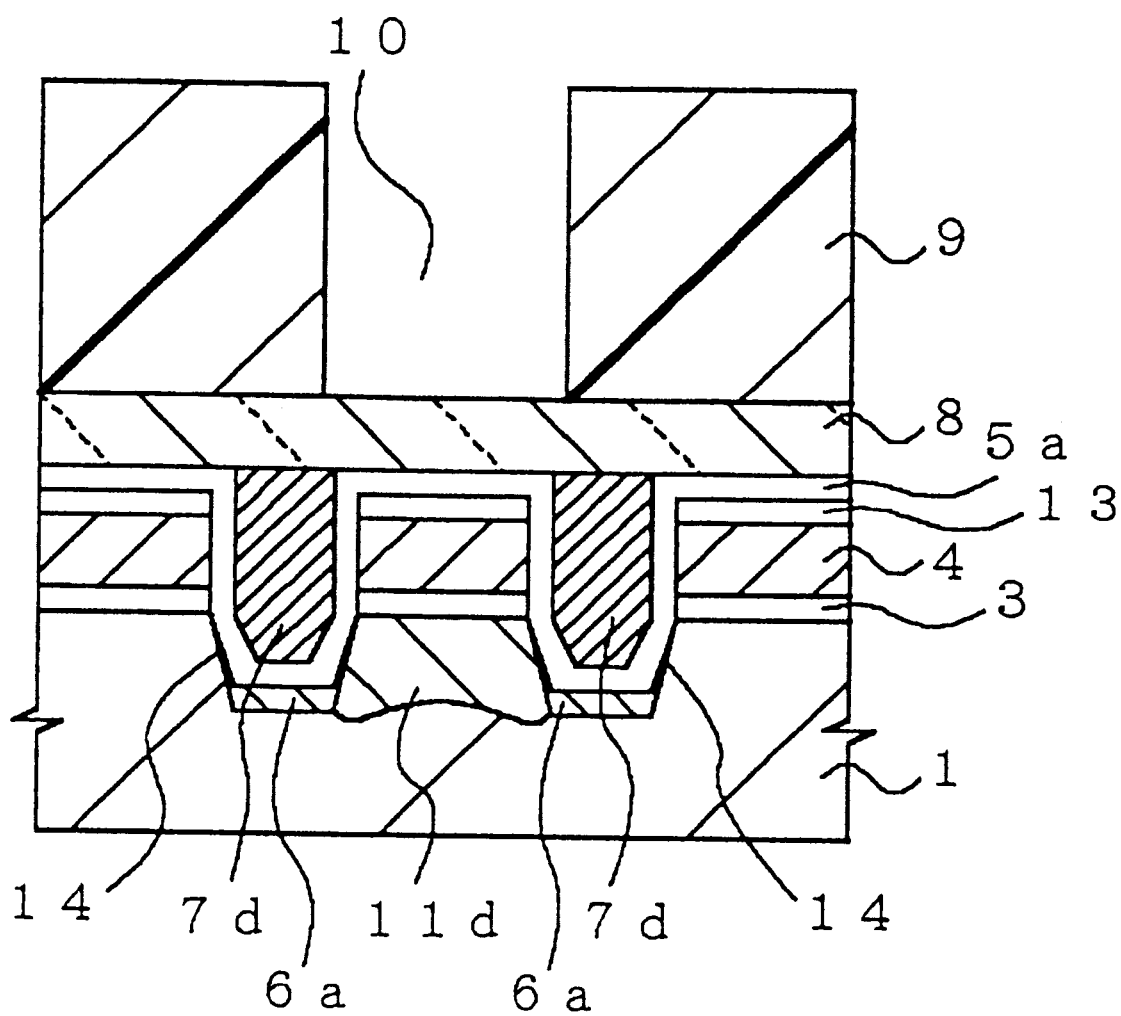
FIG. 9B is a fragmentary cross sectional elevation view illustrative of a novel memory cell structure having a single MOS field effect transistor in a mask programmable read only memory device in fifth embodiment in accordance with the present invention taken along an I-L line of FIG. 9A.

A fifth embodiment according to the present invention will be described in detail with reference to the drawings. FIG. 9A is a fragmentary plane view illustrative of a novel memory cell structure having a single MOS field effect transistor in a mask programmable read only memory device. FIG. 9B is a fragmentary cross sectional elevation view illustrative of a novel memory cell structure having a single MOS field effect transistor in a mask programmable read only memory device taken along an I-L line of FIG. 9A. A structural difference of the novel memory cell structure of this embodiment from the first embodiment is in that a plurality of the ion-implantation stopper films 7d extend not only in the apertures defined between the gate electrodes 4 but also in trench grooves 14 formed in the semiconductor substrate 1 and under the apertures defined between the gate electrodes 4, wherein the passivation film 5a extends on the bottom and side walls of the trench grooves 14 in the semiconductor substrate 1 and further extends on the side walls of the gate electrodes 4 and on the top surfaces of mask insulation films 13 formed on the top surfaces of the gate electrodes 4. The surface of the passivation film 5a on the side walls of the gate electrodes 4 and on the side walls and the bottoms of the trench grooves 14 in the semiconductor substrate 1 is in the form of deep trench grooves 14, so that the ion-implantation stopper films 7d fill the deep trench grooves 14, whereby the ion-implantation stopper films 7d extend in opposite side positions with reference to the gate electrode 4 and also extend in opposite side positions with reference to the channel region. As a result, the mask ROM diffusion region 11d extend between the ion-implantation stopper films 7d within the trench groove 14 formed in the semiconductor substrate 1. Further, the stripe-shaped p-type diffusion regions 6a are formed under the bottoms of the trench grooves 14 formed in the semiconductor substrate 1. The trench grooves 14 also serve as the trench isolations between the adjacent memory cells to reduce a leakage of current between the adjacent memory cells.

The above memory cell structure is formed over a p-type semiconductor substrate 1. A plurality of stripe-shaped n+-type diffusion regions 2 selectively extend in an upper region of the p-type semiconductor substrate 1 so that the stripe-shaped n+-type diffusion regions 2 are aligned at a constant pitch and in parallel to each other, wherein each of the stripe-shaped n+-type diffusion regions 2 has a longitudinal direction along a first direction. A plurality of gate electrodes 4 selectively extend over a gate oxide film 3 so that the gate electrodes 4 are aligned at a constant pitch and in parallel to each other, wherein each of the gate electrodes 4 has a longitudinal direction along a second direction perpendicular to the first direction. A plurality of trench grooves 14 are selectively formed in the upper regions of the semiconductor substrate 1 so that the trench grooves 14 are positioned under apertures defined between the gate electrodes 4. The trench grooves 14 also serve as the trench isolations between the adjacent memory cells to reduce a leakage of current between the adjacent memory cells. A plurality of stripe-shaped p-type diffusion regions 6a selectively extend under the bottom of the trench grooves 14 and in the deep region of the p-type semiconductor substrate 1. The stripe-shaped p-type diffusion regions 6a are provided for isolating adjacent two of the stripe-shaped n+-type diffusion regions 2 from each other. Mask insulation films 13 are provided on the top surfaces of the gate electrodes 4. A passivation film 5a extends on the bottom and side walls of the trench grooves 14 in the semiconductor substrate 1 and further extends on the side walls of the gate electrodes 4 and on the top surfaces of the mask insulation films 13 formed on the top surfaces of the gate electrodes 4. The surface of the passivation film 5a extending on the side walls of the gate electrodes 4 and on the side walls and the bottoms of the trench grooves 14 in the semiconductor substrate 1 is in the form of deep trench grooves.

A plurality of ion-implantation stopper films 7d extend not only in the apertures defined between the gate electrodes 4 but also in trench grooves 14 formed in the semiconductor substrate 1 and under the apertures defined between the gate electrodes 4. The ion-implantation stopper films 7d fill the deep trench grooves, whereby the ion-implantation stopper films 7d extend in opposite side positions with reference to the gate electrode 4 and also extend in opposite side positions with reference to the channel region. Each of the ion-implantation stopper films 7d is separated by the passivation film 5 from the adjacent ones of the gate electrodes 4. A distance between the ion-implantation stopper film 7d and the adjacent gate electrode 4 corresponds to a thickness of the passivation film 5. Namely, the ion-implantation stopper films 7d are self-aligned to the deep trench grooves which are also self-aligned to the gate electrodes 4. The ion-implantation stopper films 7d serve as ion-implantation stopper in a mask ROM code ion-implantation process to form a ROM code diffusion region in a channel region of the MOS field effect transistor for controlling a threshold voltage of the MOS field effect transistor. The ion-implantation stopper films 7d are made of a material which is capable of preventing ions from penetrating through the ion-implantation stopper films 7d and reaching upper regions of the semiconductor substrate 1 under the stripe-shaped p-type diffusion regions 6a. The ion-implantation stopper films 7d may be made of insulation or conductive materials, provided that the material is capable of preventing ions from penetrating through the ion-implantation stopper films 7d and reaching upper regions of the semiconductor substrate 1 under the stripe-shaped p-type diffusion regions 6a. If the material for the ion-implantation stopper films 7d comprises one or more elements having a large mass number, then the function as the ion-implantation stopper is high. For example, if the material for the ion-implantation stopper films 7d comprises an insulation material, a metal oxide is preferable. Further, the parasitic capacitance between adjacent two of the gate electrodes 4 results in delay in operational speed of the mask programmable read only memory or deterioration in high speed performances of the mask programmable read only memory, for which reason it is also preferable that the material for the ion-implantation stopper films 7d has a low dielectric constant so as to reduce a parasitic capacitance between adjacent two of the gate electrodes 4, thereby preventing any substantive delay in operational speed of the mask programmable read only memory due to the parasitic capacitance. A ROM code diffusion region 11d is also provided for increasing a threshold voltage of the MOS field effect transistor. The mask ROM diffusion region 11d extend between the ion-implantation stopper films 7d within the trench groove 14 formed in the semiconductor substrate 1. The provision of the ion-implantation stopper films 7d makes it possible to limit the ROM code diffusion region 11d into the channel region under the gate electrode 4. No expansion in the lateral direction of the ROM code diffusion region 11d, however, causes no variation in threshold voltage from the intended or designed value.

An inter-layer insulator 8 extends entirely over the ion-implantation stopper films 7d and the passivation film 5a. A resist mask 9 is provided over the inter-layer insulator 8, wherein the resist mask 9 has a square-shaped opening 10 which is positioned over the gate electrode 4 which is positioned over the channel region. The resist mask 9 with the square-shaped opening 10 is used as a mask for carrying out the ROM code ion-implantation to form the ROM code diffusion region 11d. This ROM code diffusion region 11d extends in a selected upper region of the semiconductor substrate 1 and under the gate electrode 4.

The provision of the ion-implantation stopper films 7d makes the memory cell of the mask programmable read only memory free from the problems as engaged with the conventional techniques as described above. It is difficult to prevent any variation in density of the patterns of the openings of the resist mask 9 to be used for the mask ROM coding ion-implantation. The variation in density of the patterns of the openings 10 of the resist mask 9 causes a substantive variation in size of the openings 10 of the resist mask 9. The size of the opening 10 in the high density region, in which the density of the openings 9 is higher than the other region, is likely to be larger than the designed or intended size, if the size of the opening 10 in the low density region, in which the density of the openings 10 is lower than the other region, corresponds to the designed or intended side.

However, in accordance with the present invention, the provision of the ion-implantation stopper films 7d makes the mask programmable read only memory free from the problems due to the variation in size of the openings of the resist mask. Even if the resist mask 9 having the opening size variation from the designed or intended size is used for carrying out the mask ROM coding ion-implantation to form the ROM code diffusion region 11d, the ion-implantation stopper films 7d capture ions of the ion-implantation except for ions to be implanted through the gate electrode 4 into the channel region under the gate electrode 4 as well as through the passivation film 5 on side walls of the gate electrode 4 to adjacent regions to the channel region, whereby the ion-implantation stopper films 7d prevent ions from passing through the ion-implantation stopper films 7d and reach the stripe-shaped p-type diffusion regions 6a. As a result, the highly accurate positions of the ion-implantation stopper films 7d allow the required highly accurate control to the size in lateral directions of the ROM code diffusion region 11d, so that the size in lateral directions of the ROM code diffusion region 11d just corresponds to the designed or intended size even enlargement in size of the opening 10 of the resist mask 9. Even if the variation in size of the opening 10 of the resist mask 9 is not so small, then the ROM code diffusion region 11d extends but only in the channel region under the gate electrode 4 and adjacent regions to the channel region. Substantially no ions are, however, implanted under the adjacent channel region under the adjacent gate electrode 4, whereby the threshold voltage of the MOS field effect transistor has substantially no variation from the designed or intended value.

Further, in the mask ROM code ion-implantation process, the ions pass through the inter-layer insulator 8 and also through the gate electrode 4, during which the ions are scattered by atoms of the inter-layer insulator 8 and the gate electrode 4. The scattered ions are, however, captured into the ion-implantation stopper films 7d and thus are prevented from passing or penetrating through the ion-implantation stopper films 7d to the regions around the channel region under the gate electrode 4 positioned under the opening 10 of the resist mask 9. Substantially no ions are, however, implanted under the adjacent channel region under the adjacent gate electrode 4, whereby the threshold voltage of the MOS field effect transistor has substantially no variation from the designed or intended value.

The provision of the ion-implantation stopper films 7d makes the memory cell structure free from the conventional problems in excess enlargement in the lateral direction of the size of the ROM code diffusion regions or in the excess extension of the ROM code diffusion regions to the adjacent channel region of the adjacent MOS field effect transistor of the adjacent memory cell. This makes it possible to realize the required increase in density of the integration of the mask programmable read only memory device.

It is unnecessary for the above novel structure to reduce the variation in size of the openings of the resist mask to be used for carrying out the mask ROM code ion-implantation to form the ROM code diffusion region 11d. Any extremely high accuracy in photo-lithography technique is not required which is, however, extremely expensive. This makes it possible to reduce the manufacturing cost of the mask programmable read only memory device.

The above novel memory cell structure having the single MOS field effect transistor with the ion-implantation stopper films 7d is suitable for preventing any substantive expansion in lateral directions of the ROM code diffusion region.

The above novel memory cell structure having the single MOS field effect transistor with the ion-implantation stopper films 7d is also suitable for preventing any substantive variation in threshold voltage of the MOS field effect transistor.

The above novel memory cell structure having the single MOS field effect transistor with the ion-implantation stopper films 7d is also suitable for allowing the semiconductor memory device such as the mask programmable read only memory to be scaled down.

The above novel memory cell structure having the single MOS field effect transistor with the ion-implantation stopper films 7d is also suitable for allowing increase in density of integration of the semiconductor memory device such as the mask programmable read only memory.

The above novel memory cell structure having the single MOS field effect transistor with the ion-implantation stopper films 7d is also suitable for allowing increase in memory capacity of the semiconductor memory device such as the mask programmable read only memory.

The above novel memory cell structure having the single MOS field effect transistor with the ion-implantation stopper films 7d is also suitable for allowing a possible reduction in manufacturing cost of the semiconductor memory device such as the mask programmable read only memory.

FIGS. 10A through 10D are fragmentary cross sectional elevation views illustrative of a novel memory cell structure having a single MOS field effect transistor in a mask programmable read only memory device in sequential steps involved in a novel method of forming the novel flat-structure memory cell of FIGS. 9A and 9B.

With reference to FIG. 1A, the stripe-shaped n+-type diffusion regions 2 not illustrated are selectively formed in an upper region of the p-type semiconductor substrate 1 so that the stripe-shaped n+-type diffusion regions 2 are aligned at a constant pitch and in parallel to each others wherein each of the stripe-shaped n+-type diffusion regions 2 has a longitudinal direction along a first direction. The stripe-shaped n+-type diffusion regions 2 may be formed by a selective ion-implantation of arsenic at an ion-implantation energy of 70 keV and at a dose of $1E15$ cm$^{-2}$ and a subsequent heat treatment, The semiconductor substrate 1 is subjected to a thermal oxidation to form a gate oxide film 3 having a thickness of 20 nanometers and also concurrently form a thick silicon oxide film having a thickness of 100 nanometers over the stripe-shaped n+-type diffusion regions 2. The reason why the thick silicon oxide films are formed over the stripe-shaped n+-type diffusion regions 2 is due to the enhanced oxidation over the stripe-shaped n+-type diffusion regions 2. A plurality of the gate electrodes 4 and the mask insulation films 13 on the gate electrodes 4 are selectively formed over the gate oxide film 3 by photolithography technique and subsequent dry etching process, so that the gate electrodes 4 are aligned at a constant pitch and in parallel to each other, wherein each of the gate electrodes 4 has a longitudinal direction along a second direction perpendicular to the first direction. The gate electrodes 4 may comprise a polycide film which comprises laminations of phosphorus doped polysilicon films having a thickness of 100 nanometers and a tungsten silicide film having a thickness of 100 nanometers. The mask insulation films 13 may comprise silicon oxide films having a thickness of 100 nanometers. The gate electrodes 4 with the mask insulation films 13 are used as masks for carrying out a dry etching process to the upper regions of the semiconductor substrate 1 in order to form trench grooves 14 which are self-aligned to the gate electrodes 4 with the mask insulation films 13. Subsequently, the gate electrodes 4 with the mask insulation films 13 are also used as masks for ion-implantation of boron at an ion-implantation energy of 30 keV and at a dose of $2E13$ cm$^{-2}$ and a subsequent heat treatment, whereby the stripe-shaped p-type diffusion regions 6 are selectively formed under the bottoms of the trench grooves 14.

Figure 10A:
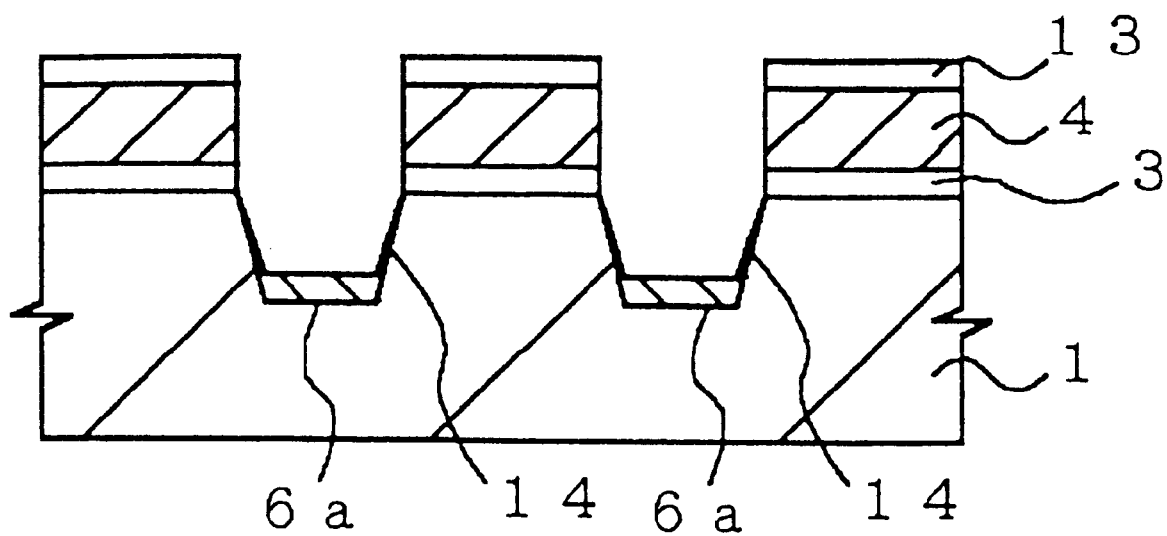
FIGS. 10A through 10D are fragmentary cross sectional elevation views illustrative of a novel memory cell structure having a single MOS field effect transistor in a mask programmable read only memory device in sequential steps involved in a novel method of forming the novel flat-structure memory cell of FIGS. 9A and 9B in fifth embodiment in accordance with the present invention.
Figure 10B:
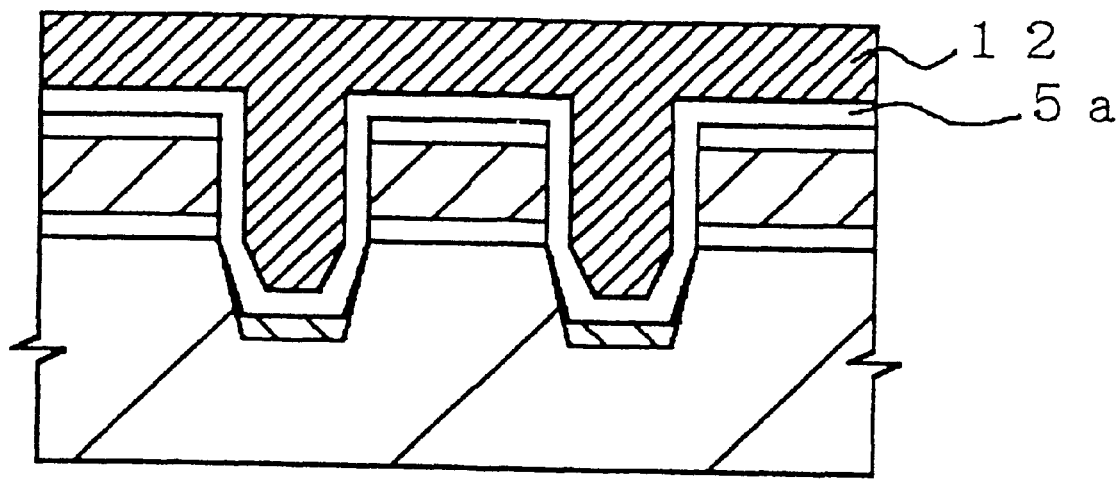

With reference to FIG. 10B, a silicon oxide film is entirely deposited by a chemical vapor deposition method to form a passivation film 5a which entirely extends on the bottom and side walls of the trench grooves 14 in the semiconductor substrate 1 and further extends on the side walls of the gate electrodes 4 and on the top surfaces of the mask insulation films 13 formed on the top surfaces of the gate electrodes 4. The surface of the passivation film 5a on the side walls of the gate electrodes 4 and on the side walls and the bottoms of the trench grooves 14 in the semiconductor substrate 1 is in the form of deep trench grooves. An ion-implantation stopper material 12 is also entirely deposited on the passivation film 5 by a chemical vapor deposition method so that the ion-implantation stopper material 12 completely fills the deep trench grooves and also deposited over the mask insulation films 13 and the gate electrodes 4, whereby a tungsten film having a thickness of 500 nanometers is thus formed. In place of the tungsten film, laminations of a titanium nitride film and a tungsten film are also available.

Figure 10C:
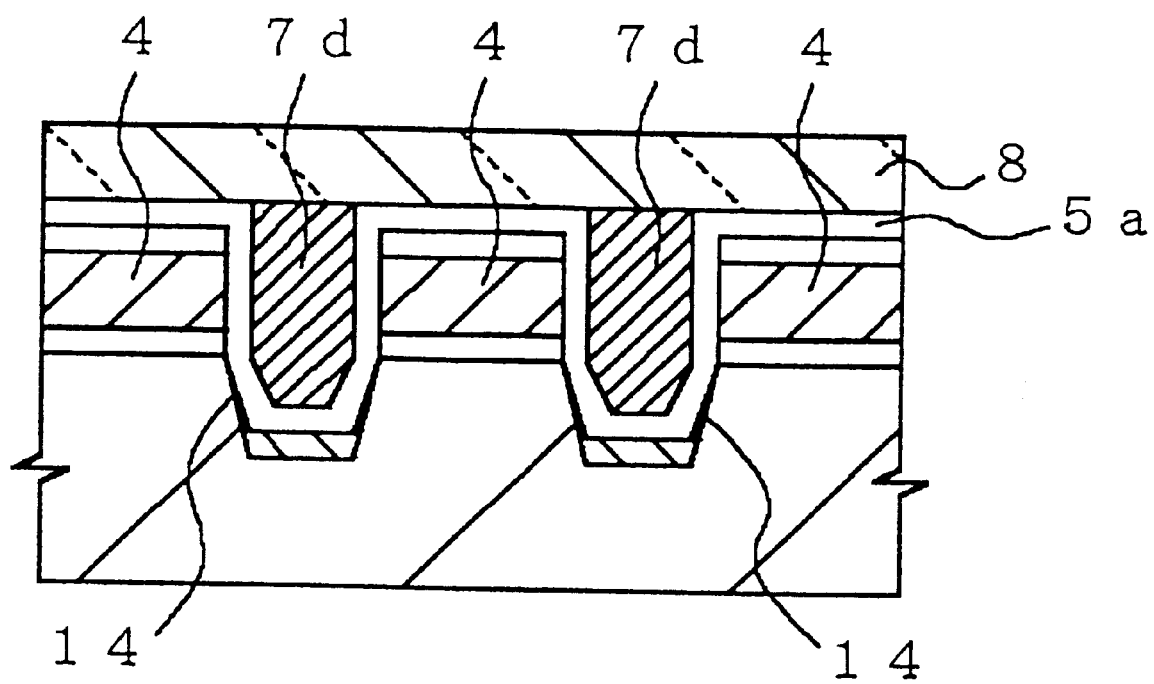

With reference to FIG. 10C, the deposited ion-implantation stopper material 12 is then subjected to a chemical mechanical polishing to selectively remove the deposited ion-implantation stopper material 12 except within the deep trench grooves, whereby the deposited ion-implantation stopper material 12 remain only within the deep trench grooves, so that the ion-implantation stopper films 7d are thus formed within the deep trench grooves.

A silicon oxide film is entirely deposited by a chemical vapor deposition method to form the inter-layer insulator 8 which extends on the ion-implantation stopper films 7d and the passivation film 5a. The inter-layer insulator 8 is then subjected to a chemical mechanical polishing for planarization of a top surface of the inter-layer insulator 8.

Figure 10D:
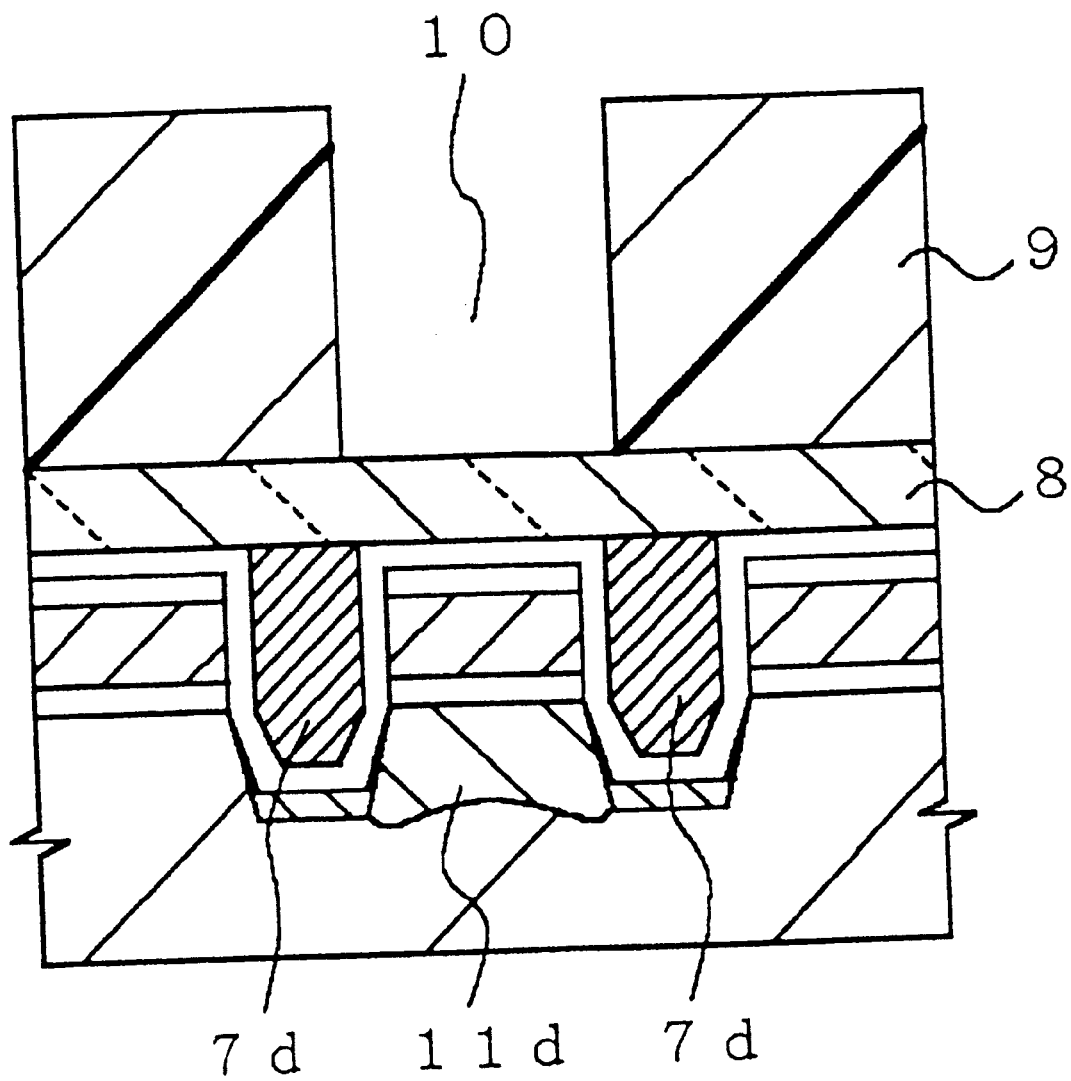

With reference to FIG. 10D, a resist mask 9 is provided over the inter-layer insulator 8, wherein the resist mask 9 has a square-shaped opening 10 which is positioned over a channel region under the gate electrode 4. The resist mask 9 with the square-shaped opening 10 is used as a mask for carrying out the ROM code ion-implantation into a selected and limited region including the channel region under the gate electrode 4. The ROM code ion-implantation is carried out with boron in a just vertical direction to the planarized surface of the inter-layer insulator 8 at an ion-implantation energy of 220 keV and at a dose of $1E14\ cm^{-2}$. Subsequently, a heat treatment is carried out by a rapid thermal anneal at a temperature of 850° C. for 15 seconds for thermal diffusion to form a ROM code diffusion region 9.

Even if the resist mask 9 having the opening size variation from the designed or intended size is used for carrying out the mask ROM coding ion-implantation to form the ROM code diffusion region old, the ion-implantation stopper films 7d capture ions of the ion-implantation except for ions to be implanted through the gate electrode 4 into the channel region under the gate electrode 4 as well as through the passivation film 5 on side walls of the gate electrode 4 to adjacent regions to the channel region, whereby the ion-implantation stopper films 7d prevent ions from passing through the ion-implantation stopper films 7d and reach the stripe-shaped p-type diffusion regions 6 and upper regions of the semiconductor substrate 1 under the stripe-shaped p-type diffusion regions 6. As a result, the highly accurate positions of the ion-implantation stopper films 7d allow the required highly accurate control to the size in lateral directions of the ROM code diffusion region 11d, so that the size in lateral directions of the ROM code diffusion region 11d just corresponds to the designed or intended size even enlargement in size of the opening 10 of the resist mask 9. Even if the variation in size of the opening 10 of the resist mask 9 is not so small, then the ROM code diffusion region 11d extends but only in the channel region under the gate electrode 4 and adjacent regions to the channel region. Substantially no ions are, however, implanted under the adjacent channel region under the adjacent gate electrode 4, whereby the threshold voltage of the MOS field effect transistor has substantially no variation from the designed or intended value.

Further, in the mask ROM code ion-implantation process, the ions pass through the inter-layer insulator 8 and also through the gate electrode 4, during which the ions are scattered by atoms of the inter-layer insulator 8 and the gate electrode 4. The scattered ions are, however, captured into the ion-implantation stopper films 7d and thus are prevented from passing or penetrating through the ion-implantation stopper films 7d to the regions around the channel region under the gate electrode 4 positioned under the opening 10 of the resist mask 9. Substantially no ions are, however, implanted under the adjacent channel region under the adjacent gate electrode 4, whereby the threshold voltage of the MOS field effect transistor has substantially no variation from the designed or intended value.

The mask ROM code ion-implantation method by use of the ion-implantation stopper films 7d makes the memory cell structure free from the conventional problems in excess enlargement in the lateral direction of the size of the ROM code diffusion regions or in the excess extension of the ROM code diffusion regions to the adjacent channel region of the adjacent MOS field effect transistor of the adjacent memory cell. This makes it possible to realize the required increase in density of the integration of the mask programmable read only memory device.

For the above novel mask ROM code ion-implantation method by use of the ion-implantation stopper films 7d, it is unnecessary to reduce the variation in size of the openings of the resist mask to be used for carrying out the mask ROM code ion-implantation to form the ROM code diffusion region 11d. Any extremely high accuracy in photo-lithography technique is not required which is, however, extremely expensive. This makes it possible to reduce the manufacturing cost of the mask programmable read only memory device.

The above novel mask ROM code ion-implantation method by use of the ion-implantation stopper films 7d is suitable for preventing any substantive expansion in lateral directions of the ROM code diffusion region.

The above novel mask ROM code ion-implantation method by use of the ion-implantation stopper films 7d is also suitable for preventing any substantive variation in threshold voltage of the MOS field effect transistor.

The above novel mask ROM code ion-implantation method by use of the ion-implantation stopper films 7d is also suitable for allowing the semiconductor memory device such as the mask programmable read only memory to be scaled down.

The above novel mask ROM code ion-implantation method by use of the ion-implantation stopper films 7d is also suitable for allowing increase in density of integration of the semiconductor memory device such as the mask programmable read only memory.

The above novel mask ROM code ion-implantation method by use of the ion-implantation stopper films 7d is also suitable for allowing increase in memory capacity of the semiconductor memory device such as the mask programmable read only memory.

The above novel mask ROM code ion-implantation method by use of the ion-implantation stopper films 7d is also suitable for allowing a possible reduction in manufacturing cost of the semiconductor memory device such as the mask programmable read only memory.

In this embodiment, the novel memory cell structure with the ion-implantation stopper films and the novel mask ROM code ion-implantation method by use of the ion-implantation stopper films are applied to the mask programmable read only memory. Notwithstanding, the novel memory cell structure with the ion-implantation stopper films and the novel mask ROM code ion-implantation method by use of the ion-implantation stopper films are also applicable to any other structure having an electrode electrically isolated from the semiconductor substrate and also having an impurity doped region including the channel region under the gate electrode for a threshold voltage control.

Further if the above ion-implantation stopper films are made of an electrically conductive material, then it is possible to fix the ion-implantation stopper films at the ground potential so as to obtain an electrical stability of the mask programmable read only memory.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A semiconductor structure comprising:

a semiconductor active region of a first conductivity type including a channel region and a non-channel diffusion region surrounding said channel region;

an insulation film extending over at least said channel region;

at least a control electrode on said insulation film for applying an electric field to said channel region;

at least a first diffusion region of said first conductivity type occupying said channel region for defining a threshold voltage of said channel region; and ion-implantation stopper films, each of said ion-implantation stopper films covering at least a part of said non-channel region but not covering at least a center region of said control electrode, and said ion-implantation stopper films being made of a material preventing ions from penetrating said ion-implantation stopper film in an ion-implantation for forming said first diffusion region and said ion-implantation stopper films each comprising a single planar upper surface, said ion-implantation stopper films being wholly located overlying a corresponding non-channel diffusion region surrounding said channel region.

2. The semiconductor structure as claimed in claim 1, wherein a plurality of said ion-implantation stopper films extend at least in opposite sides of said control electrode and also extend at least in substantially the same level as said control electrode.

3. The semiconductor structure as claimed in claim 2, wherein a plurality of said control electrodes are provided, and said ion-implantation stopper films extend at least in apertures between said control electrodes.

4. The semiconductor structure as claimed in claim 3, wherein said ion-implantation stopper films extend not only in said apertures between said control electrodes but also over edge portions of said control electrodes.

5. The semiconductor structure as claimed in claim 2, wherein said ion-implantation stopper films are self-aligned to said control electrodes.

6. The semiconductor structure as claimed in claim 1, wherein a plurality of said ion-implantation stopper films extend over opposite sides of said control electrode so that ion-implantation stopper films lie above said control electrode.

7. The semiconductor structure as claimed in claim 6, wherein a plurality of said control electrodes are provided, and an inter-layer insulator is provided which extends within apertures between said control electrodes and also over said control electrodes, and said ion-implantation stopper films extend over said inter-layer insulator within said apertures between said control electrodes.

8. The semiconductor structure as claimed in claim 1, wherein said material of said ion-implantation stopper film is an insulation material which comprises at least one element having a large mass number.

9. The semiconductor structure as claimed in claim 8, wherein said material of said ion-implantation stopper film comprises a metal oxide.

10. The semiconductor structure as claimed in claim 8, wherein said material of said ion-implantation stopper film has a low dielectric constant.

11. A semiconductor memory cell structure having a field effect transistor which has a semiconductor structure as claimed in claim 1.

12. A semiconductor structure comprising:

a semiconductor active region of a first conductivity type including a channel region and a non-channel region surrounding said channel region;

an insulation film extending over at least said channel region;

at least a control electrode on said insulation film for applying an electric field to said channel region;

at least a first diffusion region of said first conductivity type occupying said channel region for defining a threshold voltage of said channel region; and ion-implantation stopper films, each of said ion-implantation stopper films covering at least a part of said non-channel region but not covering at least a center region of said control electrode, and said ion-implantation stopper films being made of a material preventing ions from penetrating said ion-implantation stopper film in an ion-implantation for forming said first diffusion region and said ion-implantation stopper films each comprising a single planar upper surface wherein a plurality of said ion-implantation stopper films extend at least in opposite sides of said control electrode and also extend at least in substantially the same level as said control electrode wherein a plurality of said control electrodes are provided, and said ion-implantation stopper films extend at least in apertures between said control electrodes, wherein said ion-implantation stopper films extend not only in said apertures between said control electrodes but also within grooves formed in said semiconductor active region and positioned under said apertures, so that lower parts of said ion-implantation stopper films are positioned in opposite sides of said first diffusion region.

13. A semiconductor structure comprising:

a semiconductor active region of a first conductivity type including a channel region and a non-channel region surrounding said channel region;

an insulation film extending over at least said channel region;

at least a control electrode on said insulation film for applying an electric field to said channel region;

at least a first diffusion region of said first conductivity type occupying said channel region for defining a threshold voltage of said channel region; and ion-implantation stopper films, each of said ion-implantation stopper films covering at least a part of said non-channel region but not covering at least a center region of said control electrode, and said ion-implantation stopper films being made of a material preventing ions from penetrating said ion-implantation stopper film in an ion-implantation for forming said first diffusion region and said ion-implantation stopper films each comprising a single planar upper surface wherein a plurality of said ion-implantation stopper films extend at least in opposite sides of said control electrode and also extend at least in substantially the same level as said control electrode wherein a plurality of said control electrodes are provided, and said ion-implantation stopper films extend at least in apertures between said control electrodes, wherein said ion-implantation stopper films are separated by a passivation film from said control electrodes.

14. A semiconductor structure comprising:

a semiconductor active region of a first conductivity type including a channel region and a non-channel region surrounding said channel region;

an insulation film extending over at least said channel region;

at least a control electrode on said insulation film for applying an electric field to said channel region;

at least a first diffusion region of said first conductivity type occupying said channel region for defining a threshold voltage of said channel region; and ion-implantation stopper films, each of said ion-implantation stopper films covering at least a part of said non-channel region but not covering at least a center region of said control electrode, and said ion-implantation stopper films being made of a material preventing ions from penetrating said ion-implantation stopper film in an ion-implantation for forming said first diffusion region and said ion-implantation stopper films each comprising a single planar upper surface, wherein said material of said ion-implantation stopper film is a conductive material which comprises at least one element having a large mass number.

15. The semiconductor structure as claimed in claim 14, wherein said ion-implantation stopper film is grounded so that said ion-implantation stopper film has a ground potential.

16. A semiconductor memory cell structure comprising:

a semiconductor substrate having an active region of a first conductivity type, and said active region including a channel region and a non-channel region surrounding said channel region;

source and drain diffusion regions in parts of said non-channel region in said active region;

a gate insulation film extending over at least said channel region;

a plurality of gate electrodes on said insulation film;

at least a first diffusion region of said first conductivity type occupying said channel region for defining a threshold voltage of said channel region; and a plurality of ion-implantation stopper films, each of said stopper films covering at least parts of said non-channel region in opposite side regions of said gate electrode but not covering at least a center region of said gate electrode, and said ion-implantation stopper film being made of a material preventing ions from penetrating said ion-implantation stopper film in an ion-implantation for forming said first diffusion region, the ion-implantation stopper films being wholly located overlying a corresponding source or drain diffusion region.

17. The semiconductor memory cell structure as claimed in claim 16, wherein a plurality of said gate electrodes are provided, and said ion-implantation stopper films extend at least in apertures between said gate electrodes.

18. The semiconductor memory cell structure as claimed in claim 17, wherein said ion-implantation stopper films extend not only in said apertures between said gate electrodes but also over edge portions of said gate electrodes.

19. The semiconductor memory cell structure as claimed in claim 17, wherein said ion-implantation stopper films extend not only in said apertures between said gate electrodes but also within grooves formed in said semiconductor active region and positioned under said apertures, so that lower parts of said ion-implantation stopper films are positioned in opposite sides of said first diffusion region.

20. The semiconductor memory cell structure as claimed in claim 17, wherein said ion-implantation stopper films are separated by a passivation film from said gate electrodes.

21. The semiconductor memory cell structure as claimed in claim 16, wherein said ion-implantation stopper films are self-aligned to said gate electrodes.

22. The semiconductor memory cell structure as claimed in claim 16, wherein a plurality of said gate electrodes are provided, and an inter-layer insulator is provided which extends within apertures between said gate electrodes and also over said gate electrodes, and said ion-implantation stopper films extend over said inter-layer insulator within said apertures between said gate electrodes so that said ion-implantation stopper films extend over opposite sides of said gate electrode, and ion-implantation stopper films lie above said gate electrode.

23. A semiconductor structure comprising:

a semiconductor active region of a first conductivity type including a channel region and a non-channel region surrounding said channel region;

an insulation film extending over at least said channel region;

at least a control electrode on said insulation film for applying an electric field to said channel region;

at least a first diffusion region of said first conductivity type occupying said channel region for defining a threshold voltage of said channel region; and at least an ion-implantation stopper film extending in at least a part of said non-channel region and also at least lying a below level to said control electrode but not underlying said control electrode, and lower parts of said ion-implantation stopper film being positioned in opposite sides of said first diffusion region, and said ion-implantation stopper film being made of a material preventing ions from penetrating said ion-implantation stopper film in an ion-implantation for forming said first diffusion region.

24. The semiconductor structure as claimed in claim 23, wherein said ion-implantation stopper films extend not only within grooves formed in said semiconductor active region and positioned under said apertures but also in said apertures between said control electrodes.

* * * * *